(12) United States Patent
Wang et al.

(10) Patent No.: US 12,209,013 B2
(45) Date of Patent: Jan. 28, 2025

(54) ARCHED MEMBRANE STRUCTURE FOR MEMS DEVICE

(71) Applicant: Taiwan Semiconductor Manufacturing Co., Ltd., Hsinchu (TW)

(72) Inventors: Jhao-Yi Wang, Tainan (TW); Chin-Yu Ku, Hsinchu (TW); Wen-Hsiung Lu, Tainan (TW); Lung-Kai Mao, Kaohsiung (TW); Ming-Da Cheng, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/365,997

(22) Filed: Aug. 6, 2023

(65) Prior Publication Data

US 2024/0017988 A1 Jan. 18, 2024

Related U.S. Application Data

(62) Division of application No. 17/323,147, filed on May 18, 2021.
(Continued)

(51) Int. Cl.
*B81C 1/00* (2006.01)
*B81B 3/00* (2006.01)
(Continued)

(52) U.S. Cl.
CPC ........ *B81C 1/00158* (2013.01); *B81B 3/0072* (2013.01); *H01L 25/0655* (2013.01);
(Continued)

(58) Field of Classification Search
CPC ............... H01L 25/50; B81B 2203/033; B81B 2203/0127; B81B 2203/0392;
(Continued)

(56) References Cited

U.S. PATENT DOCUMENTS 7,104,768 B2 9/2006 Richter et al.
7,270,011 B2 9/2007 Vossenberg
(Continued)

FOREIGN PATENT DOCUMENTS

CN 102066239 A 5/2011
CN 105338457 A 2/2016
(Continued)

*Primary Examiner* — Victor A Mandala
*Assistant Examiner* — Lawrence C Tynes, Jr.
(74) *Attorney, Agent, or Firm* — Slater Matsil, LLP

(57) ABSTRACT

A method includes bonding a supporting substrate to a semiconductor substrate of a wafer. A bonding layer is between, and is bonded to both of, the supporting substrate and the semiconductor substrate. A first etching process is performed to etch the supporting substrate and to form an opening, which penetrates through the supporting substrate and stops on the bonding layer. The opening has substantially straight edges. The bonding layer is then etched. A second etching process is performed to extend the opening down into the semiconductor substrate. A bottom portion of the opening is curved.

20 Claims, 24 Drawing Sheets

Related U.S. Application Data

(60) Provisional application No. 63/148,641, filed on Feb. 12, 2021.

(51) Int. Cl.
  *H01L 25/00* (2006.01)
  *H01L 25/065* (2023.01)

(52) U.S. Cl.
  CPC ...... *H01L 25/50* (2013.01); *B81B 2203/0127* (2013.01); *B81B 2203/033* (2013.01); *B81C 2201/013* (2013.01)

(58) Field of Classification Search
  CPC . B81B 2201/0257; B81B 7/02; B81B 7/0003; B81C 2201/013; B81C 1/00103; B81C 1/00158; B81C 1/00246
  See application file for complete search history.

(56) References Cited

U.S. PATENT DOCUMENTS

| | | | |
|---|---|---|---|
| 9,458,009 B2 | 10/2016 | Dehe et al. | |
| 9,630,837 B1* | 4/2017 | Chu | B81B 3/0021 |
| 10,941,034 B1* | 3/2021 | Chu | B81C 1/00158 |
| 10,969,575 B2 | 4/2021 | Torkkeli et al. | |
| 2005/0040484 A1* | 2/2005 | Busta | H01H 1/0036 257/414 |
| 2006/0292877 A1* | 12/2006 | Lake | H01L 23/481 438/719 |
| 2011/0215672 A1* | 9/2011 | Yamaoka | B81B 3/0072 310/300 |
| 2014/0264651 A1* | 9/2014 | Dehe | B81B 3/0027 257/416 |
| 2015/0236249 A1* | 8/2015 | Deshpande | H10N 50/01 257/421 |
| 2017/0297904 A1* | 10/2017 | Lin | B81C 1/00285 |
| 2018/0115836 A1* | 4/2018 | Hsieh | H04R 31/003 |
| 2018/0327254 A1* | 11/2018 | Cheng | B81C 1/00301 |
| 2019/0033252 A1* | 1/2019 | Huang | H10N 30/2047 |
| 2020/0056934 A1* | 2/2020 | Parker | B81B 7/0061 |
| 2020/0069890 A1* | 3/2020 | Vigevani | H10N 30/853 |
| 2020/0209615 A1* | 7/2020 | Lee | B81C 1/00404 |
| 2020/0304923 A1* | 9/2020 | Brioschi | H04R 19/005 |
| 2020/0371376 A1* | 11/2020 | Giusti | H10N 30/2044 |
| 2021/0082667 A1* | 3/2021 | Zhao | H01L 21/31116 |
| 2022/0206161 A1* | 6/2022 | Lu | G02B 26/121 |
| 2022/0274827 A1* | 9/2022 | Yang | B81C 1/0069 |
| 2023/0019457 A1* | 1/2023 | Kampfe | H10N 30/302 |

FOREIGN PATENT DOCUMENTS

| | | |
|---|---|---|
| DE | 102014103341 A1 | 9/2014 |
| DE | 102018219380 A1 | 5/2019 |
| EP | 0969505 A2 | 1/2000 |
| EP | 3518631 A1 | 7/2019 |
| FR | 2869600 A1 | 11/2005 |
| KR | 20160025546 A | 3/2016 |
| TW | I718729 B | 2/2011 |
| TW | 201725170 A | 7/2017 |
| WO | 2004018875 A1 | 3/2004 |

\* cited by examiner

ARCHED MEMBRANE STRUCTURE FOR MEMS DEVICE

PRIORITY CLAIM AND CROSS-REFERENCE

This application is a divisional of U.S. patent application Ser. No. 17/323,147, filed May 18, 2021, and entitled "Arched Membrane Structure for MEMS Device," which claims the benefit of the U.S. Provisional Application No. 63/148,641, filed on Feb. 12, 2021, and entitled "A Novel Bridge-Like Membrane Structure for MEMS Device," which applications are hereby incorporated herein by reference.

BACKGROUND

Micro Electro Mechanical System (MEMS) devices often have membranes, which are flexible structures subjecting to movement. Membranes are thin enough, so that they may vibrate. It is desirable to have thin membranes so that the membranes are sensitive, while at the same time, are structurally strong and can withstand stress.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
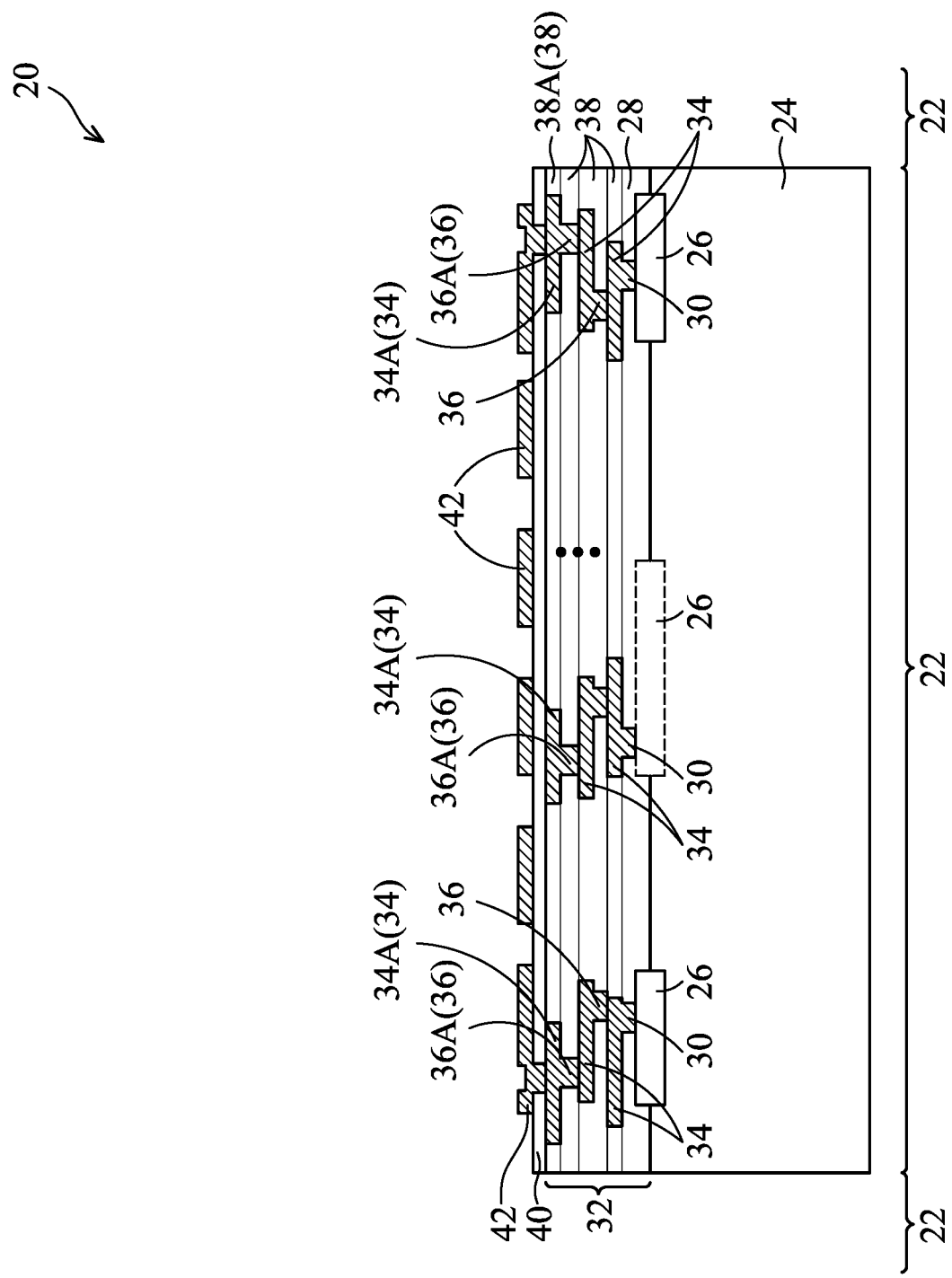
FIGS. 1 through 13 illustrate the cross-sectional views of intermediate stages in the formation of a Micro Electro Mechanical System (MEMS) device having an arched opening in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Micro Electro Mechanical System (MEMS) device having an arched opening and the method of forming the same are provided. In accordance with some embodiments of the present disclosure, the arched opening is formed through two or more etching processes, which includes a first etching process to etch a supporting substrate and to reveal a membrane layer (such as a silicon layer), and a second etching process to form an arch. With the arched opening, the membrane is mechanical strong and can withstand higher stresses. The warpage of the respective die is also reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 24:
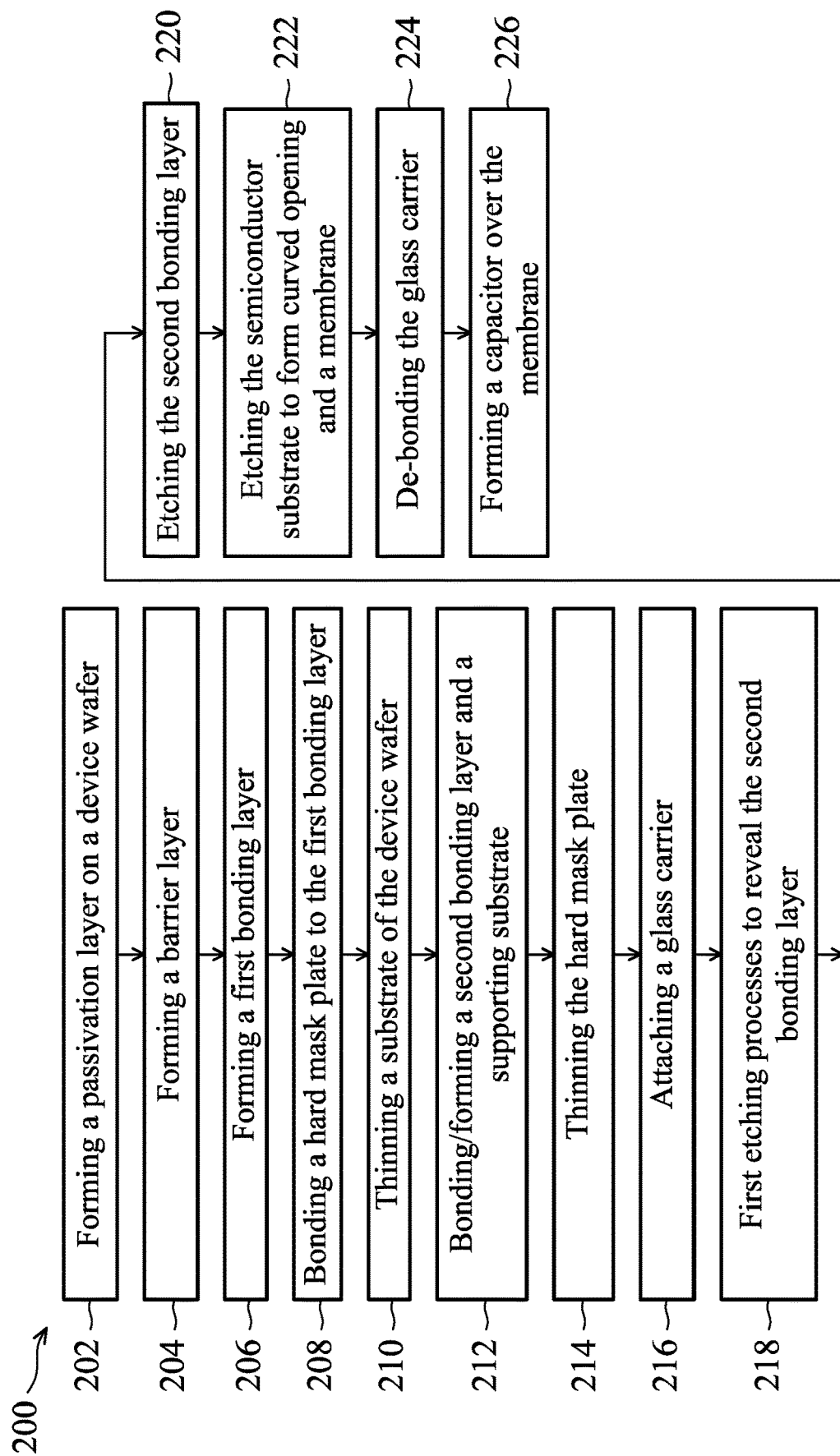
FIG. 24 illustrates a process flow for forming a MEMS device in accordance with some embodiments.

FIGS. 1 through 13 illustrate the cross-sectional views of intermediate stages in the formation of a MEMS device with an arched opening in accordance with some embodiments of the present disclosure. The corresponding processes are also reflected schematically in the process flow 200 as shown in FIG. 24.

FIG. 1 illustrates a cross-sectional view of device 20. In accordance with some embodiments of the present disclosure, device 20 is or comprises a device wafer including active devices and possibly passive devices, which are represented as integrated circuit devices 26. Device 20 may include a plurality of chips 22 therein, with one of chips 22 being illustrated. In accordance with alternative embodiments of the present disclosure, device 20 is free from active devices, and may or may not include passive devices. In subsequent discussion, a device wafer is used as an example of device 20, and device 20 is accordingly referred to as wafer 20. The embodiments of the present disclosure, however, may also be applied on other types of package components such as interposer wafers.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24.

Figure 13:
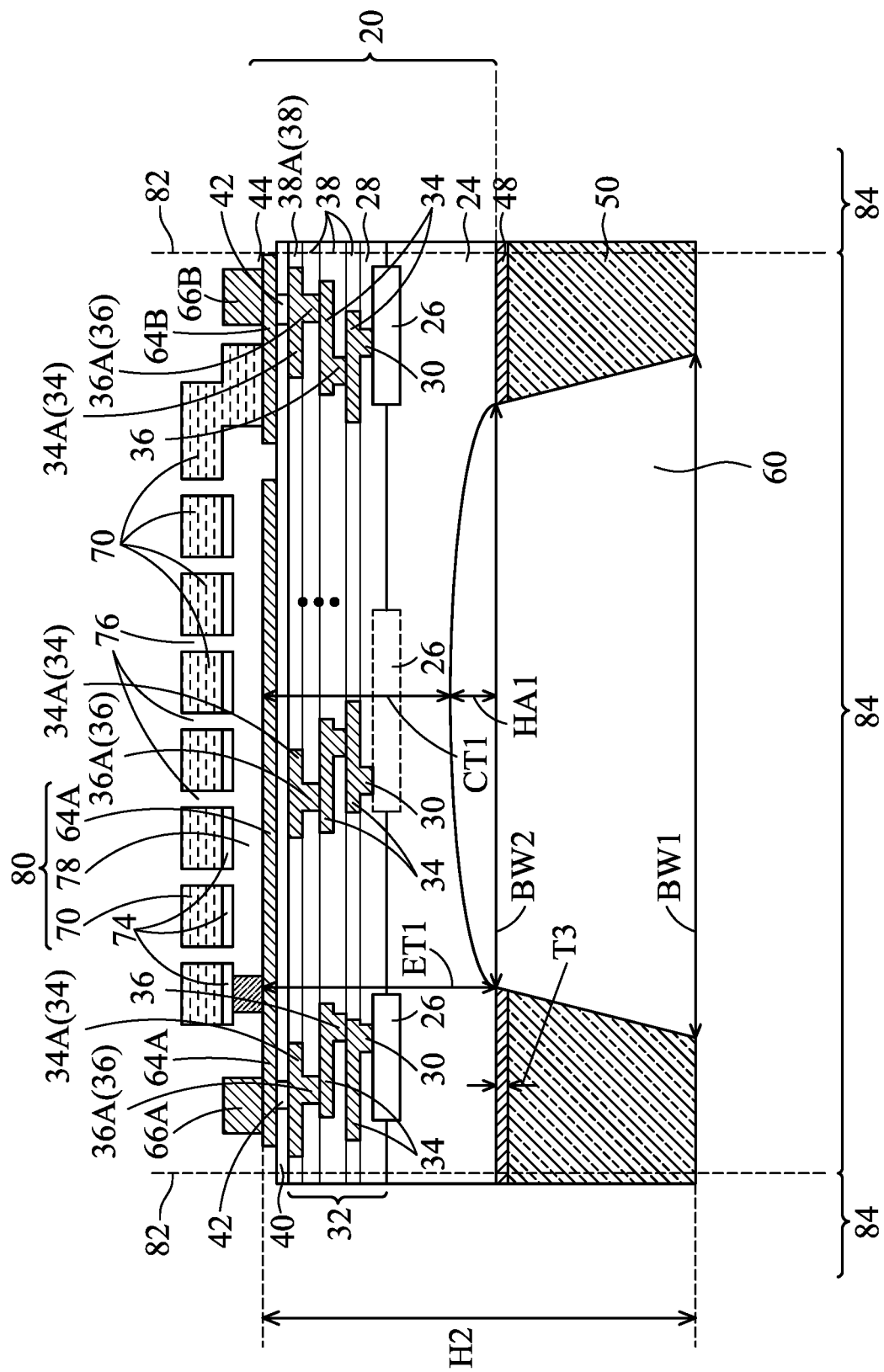

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate. In accordance with some embodiments, as shown in FIG. 13, a portion of the substrate 24 may have an opening 60 (FIG. 13) formed in subsequent processes, and integrated circuit devices 26 may or may not be formed directly over opening 60. Accordingly, the integrated circuit devices 26 directly over opening 60 are illustrated as being dashed to indicate these parts of the integrated circuit devices may be, or may not be, formed.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon nitride, silicon oxynitride ($SiO_xN_y$), low-k dielectric materials, or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys therefore, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Interconnect structure 32 are formed over ILD 28 and contact plugs 30. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. The metal lines 34 in different metal layers are interconnected through vias 36. Metal lines 34 and vias 36 may be formed of copper or copper alloys, and can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38, and then performing a curing process to drive out the porogen. The remaining dielectric layers 38 are thus porous.

The formation of metal lines 34 and vias 36 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads (denoted as 34A) in a top dielectric layer (denoted as dielectric layer 38A), which is the topmost layer of dielectric layers 38. The vias immediately underlying top metal lines 34A are denoted as vias 36A. In accordance with some embodiments, dielectric layer 38A is formed of a low-k dielectric material similar to the materials of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A, when formed of a non-low-k dielectric layer, may be immediately overlying and contacting an underlying low-k dielectric layer 38. Top metal features 34A may also be formed of copper or a copper alloy, and may have a dual damascene structure or a single damascene structure. Dielectric layer 38A is sometimes referred to as a top dielectric layer.

Passivation layer 40 is formed over interconnect structure 32. The respective process is illustrated as process 202 in the process flow 200 as shown in FIG. 24. In accordance with some embodiments, passivation layer 40 is formed of a non-low-k dielectric material having a dielectric constant equal to or greater than the dielectric constant of silicon oxide. Passivation layer 40 may be formed of or comprise an inorganic dielectric material, which may include a material selected from, and is not limited to, silicon nitride ($SiN_x$), silicon oxide ($SiO_2$), silicon carbide (SiC), silicon oxynitride ($SiON_x$), silicon oxy-carbide ($SiOC_x$), or the like, combinations thereof, and/or multi-layers thereof. The value "x" represents the relative atomic ratio. The formation process may include Low-Pressure Chemical Vapor Deposition (LPCVD), Plasma Enhanced Chemical Vapor Deposition (PECVD), Physical Vapor Deposition (PVD), Atomic Layer Deposition (ALD), Plasma Enhanced Atomic Layer Deposition (PEALD), or the like. In accordance with some embodiments, the top surfaces of top dielectric layer 38A and metal lines/pads 34A are coplanar. Accordingly, passivation layer 40 may be a planar layer. In accordance with alternative embodiments, the top conductive features protrude higher than the top surface of the top dielectric layer 38A, and passivation layer 40 is non-planar.

Passivation layer 40 is patterned in an etching process to form openings. The etching process may include a dry etching process, which includes forming a patterned etching mask (not shown) such as a patterned photo resist, and then etching passivation layer 40. The patterned etching mask is then removed. Metal lines and pads 34A are exposed through the openings.

Barrier layer 42 is formed to extend into passivation layer 40 in accordance with some embodiments. The respective process is illustrated as process 204 in the process flow 200 as shown in FIG. 24. Barrier layer 42 may extend into the openings in passivation layer 40 to contact metal lines/pads 34A, so that barrier layer 42 is electrically connected to the integrated circuit devices 26. Barrier layer 42 may be used for preventing charge accumulation in dielectric layers and integrated circuit devices 26. In accordance with some embodiments, barrier layer 42 comprises a titanium layer and a copper layer over the titanium layer. The deposition process may be performed using PVD to deposit a titanium layer and a copper seed layer. Copper is then deposited over the copper seed layer. Barrier layer 42 may be a blanket layer that is not patterned. Alternatively, barrier layer 42 may be patterned through an etching process, so that plurality of discrete portions are formed, each connecting to the respective underlying integrated circuit devices 26 through a via in passivation layer 40.

Figure 2:
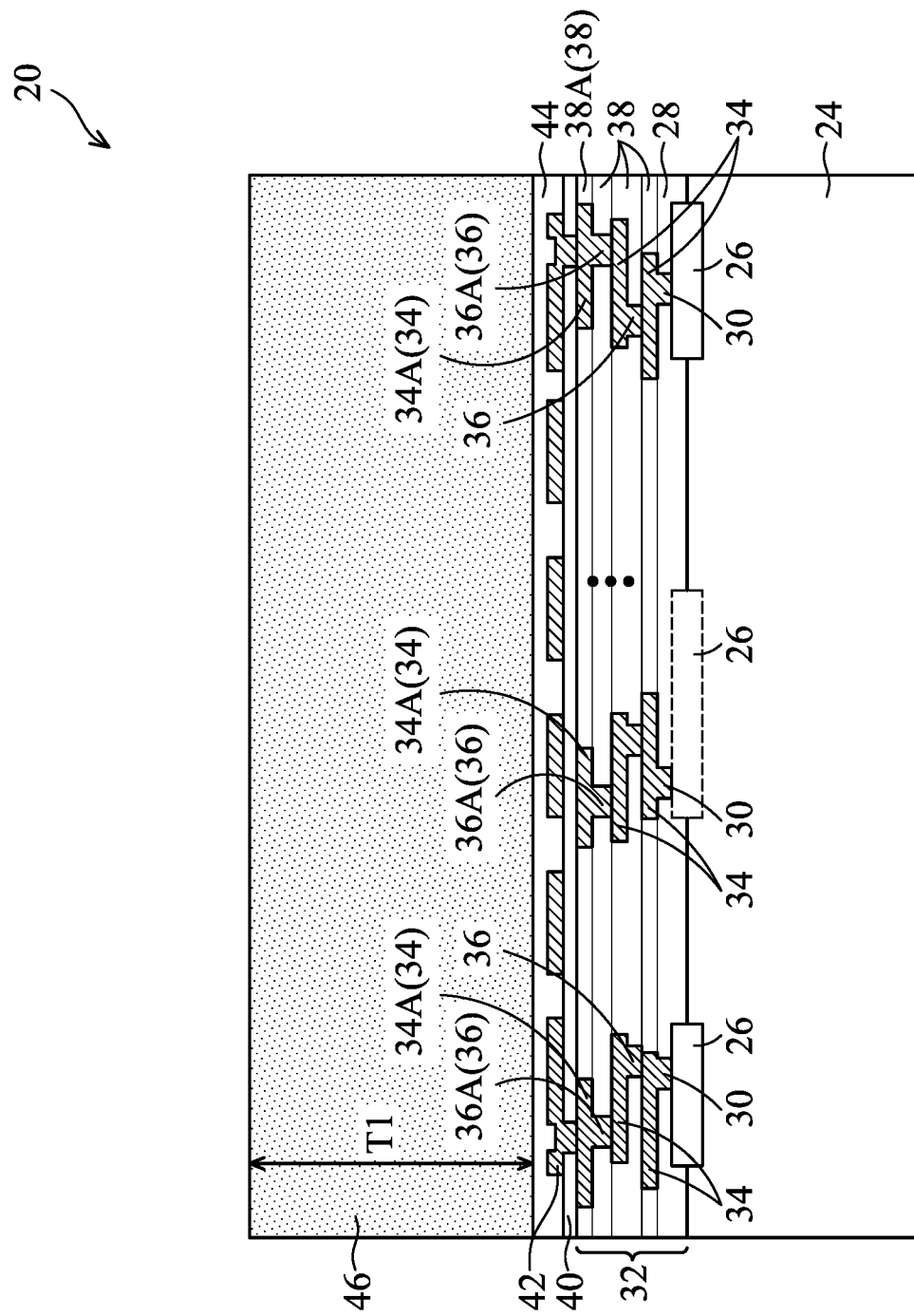

In a subsequent process, as shown in FIG. 2, bonding layer 44 is deposited on barrier layer 42. The respective process is illustrated as process 206 in the process flow 200 as shown in FIG. 24. In accordance with some embodiments, bonding layer 44 is formed of or comprises a silicon-containing material, which may include $SiO_2$, SiN, SiC, SiON, SiOCN, or the like. The formation process may include LPCVD, PECVD, PVD, ALD, PEALD, or the like. After the deposition, a planarization process such as a Chemical Mechanical Polish (CMP) process or a mechanical grinding process may be performed, so that the top surface of bonding layer 44 is planar.

Further referring to FIG. 2, hard mask plate 46 is bonded to bonding layer 44. The respective process is illustrated as process 208 in the process flow 200 as shown in FIG. 24. In accordance with some embodiments, hard mask plate 46 may include a silicon-containing material such as silicon. For example, hard mask plate 46 may be a silicon substrate. In accordance with alternative embodiments, hard mask plate 46 is formed of another material (such as silicon carbide) different from the material of bonding layer 44. Hard mask plate 46 is thick enough so that it may be used as a carrier in the subsequent thinning of substrate 24. In accordance with some embodiments, the thickness T1 of hard mask plate 46 is in the range between about 500 μm and about 1,000 μm. The bonding of hard mask plate 46 to bonding layer 44 may be performed through fusion bonding, for example with Si—O—Si bonds formed to join hard mask plate 46 to bonding layer 44.

Figure 3:
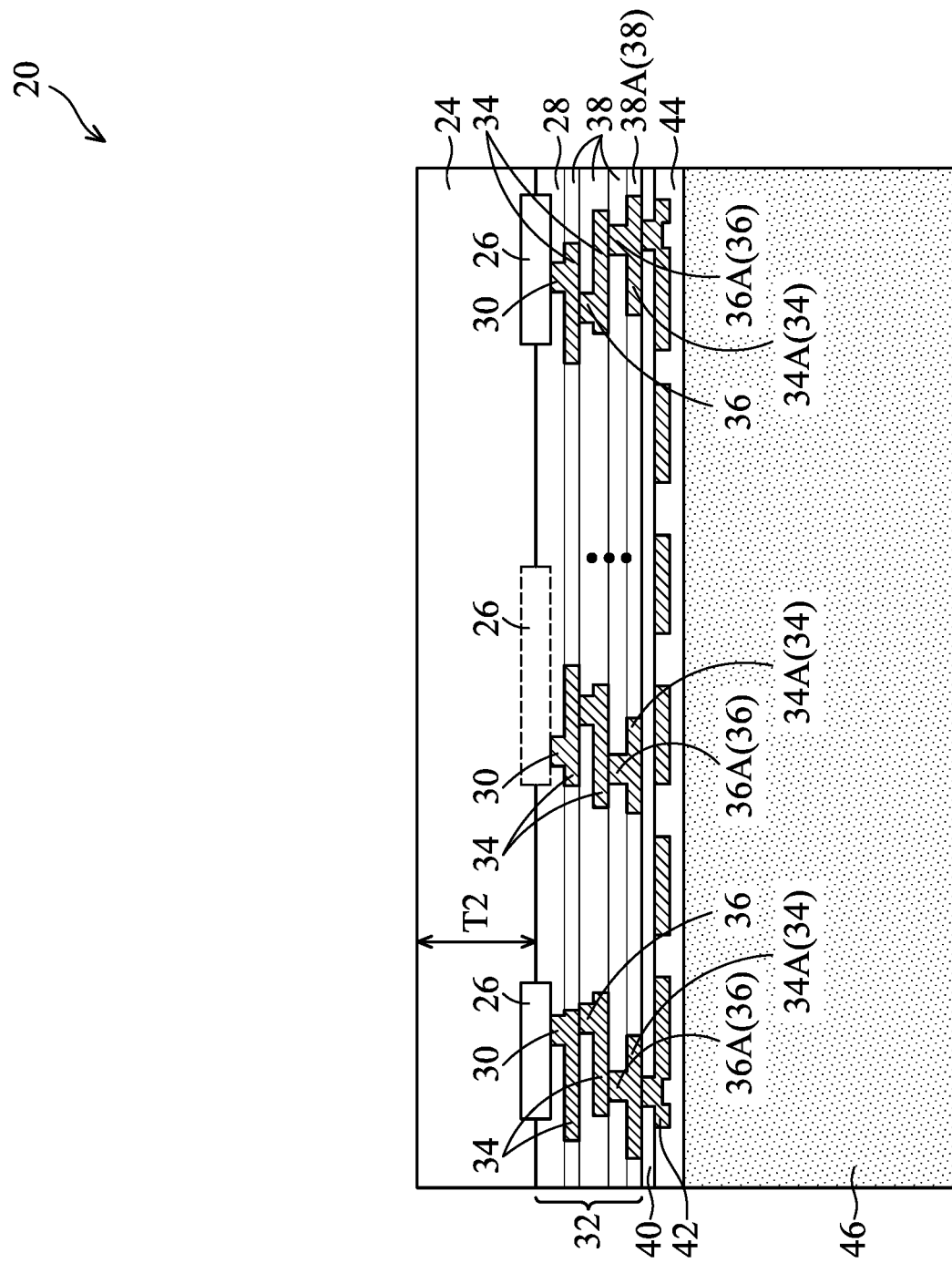

The structure as shown in FIG. 2 is then flipped upside down, as shown in FIG. 3. Semiconductor substrate 24 is then thinned. The respective process is illustrated as process 210 in the process flow 200 as shown in FIG. 24. The thickness T2 of the thinned semiconductor substrate 24 is related to what kind of device is to be formed. In accordance with some embodiments, the thickness T2 of the thinned semiconductor substrate 24 is in the range between about 50 μm and about 100 μm.

Figure 4:
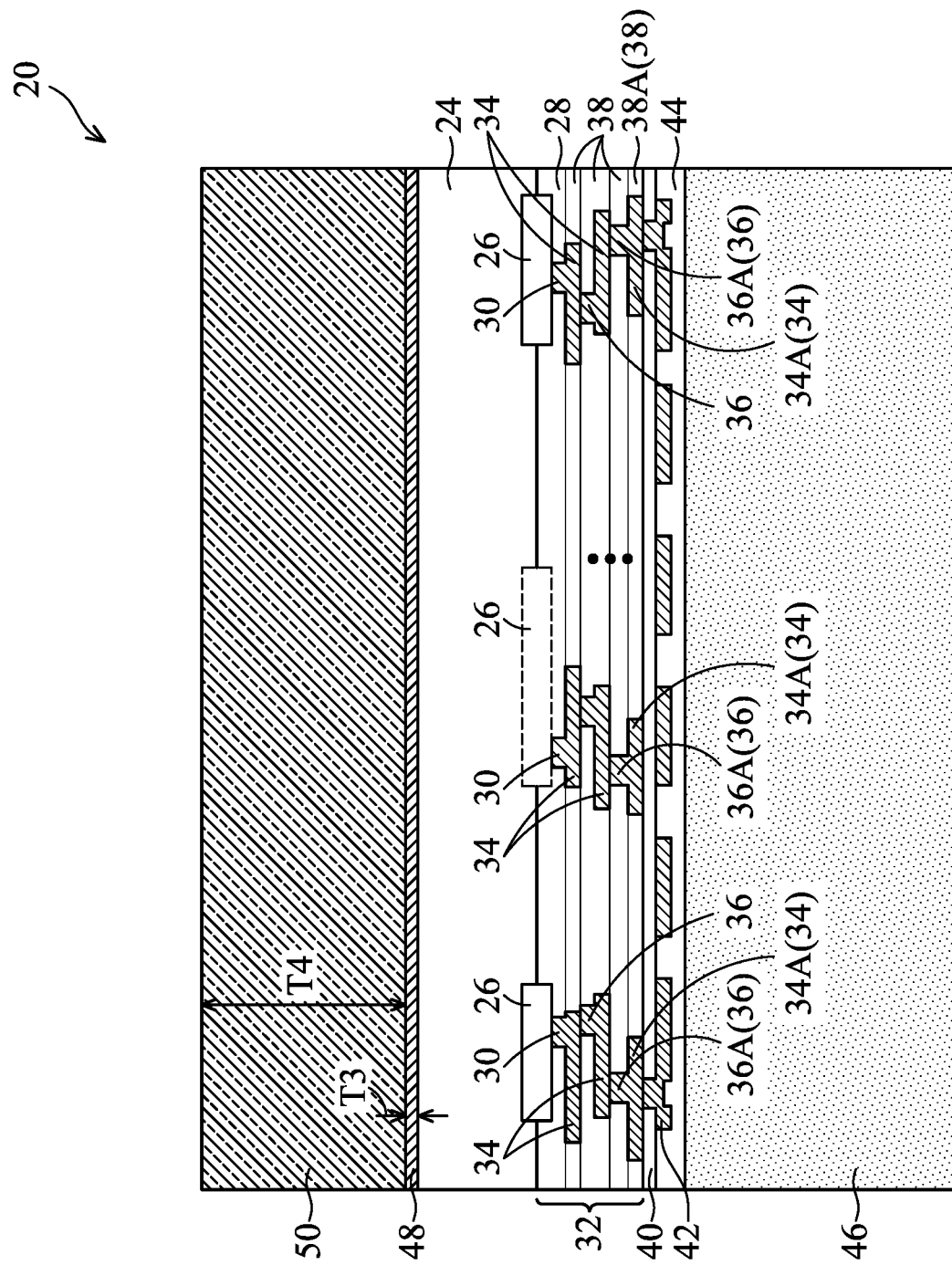

Referring to FIG. 4, supporting substrate 50 is bonded to semiconductor substrate 24. The respective process is illustrated as process 212 in the process flow 200 as shown in FIG. 24. Supporting substrate 50 may be bonded to semiconductor substrate 24 through bonding layer 48. In accordance with some embodiments, bonding layer 48 is deposited on semiconductor substrate 24, and supporting substrate 50 is bonded to bonding layer 48. In accordance with alternative embodiments, bonding layer 48 is pre-formed on supporting substrate 50, for example, through thermal oxidation or deposition, and the structure including bonding layer 48 and supporting substrate 50 are bonded to semiconductor substrate 24. Bonding layer 48 may be a silicon-containing dielectric layer formed of or comprising $SiO_2$, SiN, SiC, SiON, or the like. The deposition process may include LPCVD, PECVD, PVD, ALD, PEALD, or the like. The bonding of bonding layer 48 to supporting substrate 50 and semiconductor substrate 24 may include fusion bonding. In accordance with some embodiments, the thickness T3 of bonding layer 48 may be in the range between about 1 μm and about 5 μm. The thickness T4 of supporting substrate 50 may be in the range between about 500 μm and about 775 μm.

Figure 5:
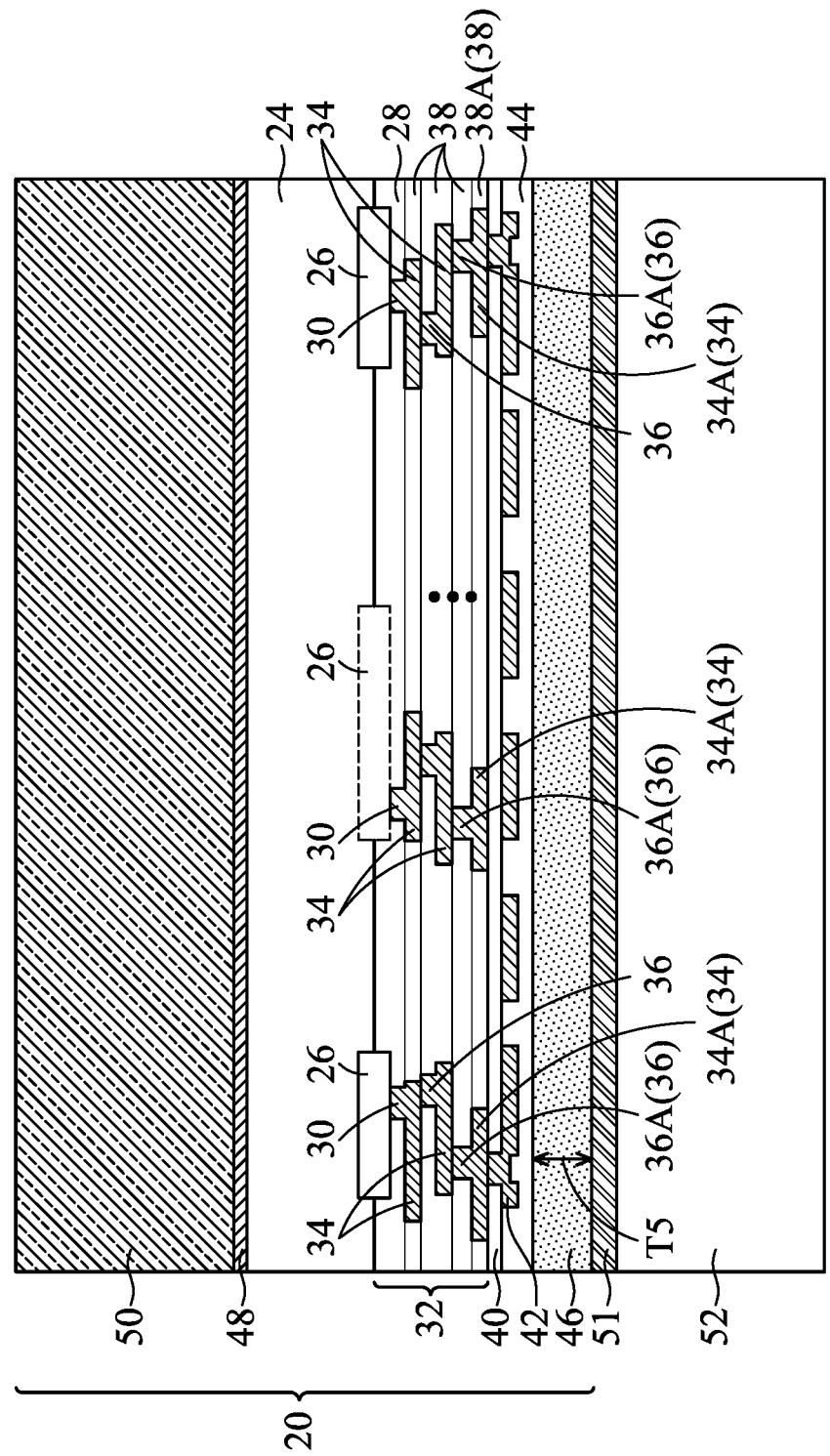

Referring to FIG. 5, hard mask plate 46 is thinned, for example, through a CMP process or a mechanical grinding process. The respective process is illustrated as process 214 in the process flow 200 as shown in FIG. 24. The thickness T5 of the resulting hard mask plate 46 may be in the range between about 30 μm and about 100 μm. In accordance with alternative embodiments, the thinning of hard mask plate 46 is skipped.

In a subsequent process, as also shown in FIG. 5, carrier 52 is attached to hard mask plate 46 through release film 51. Carrier 52 may be formed of a transparent material, which may be a glass carrier, a ceramic carrier, or the like. The respective process is illustrated as process 216 in the process flow 200 as shown in FIG. 24. Release film 51 may be formed of a Light-To-Heat-Conversion (LTHC) coating material, which is applied on carrier 52 through coating. In accordance with some embodiments of the present disclosure, the LTHC coating material is capable of being decomposed under the heat of light/radiation (such as a laser beam), and hence can release hard mask plate 46 from carrier 52 in subsequent processes.

Figure 6:
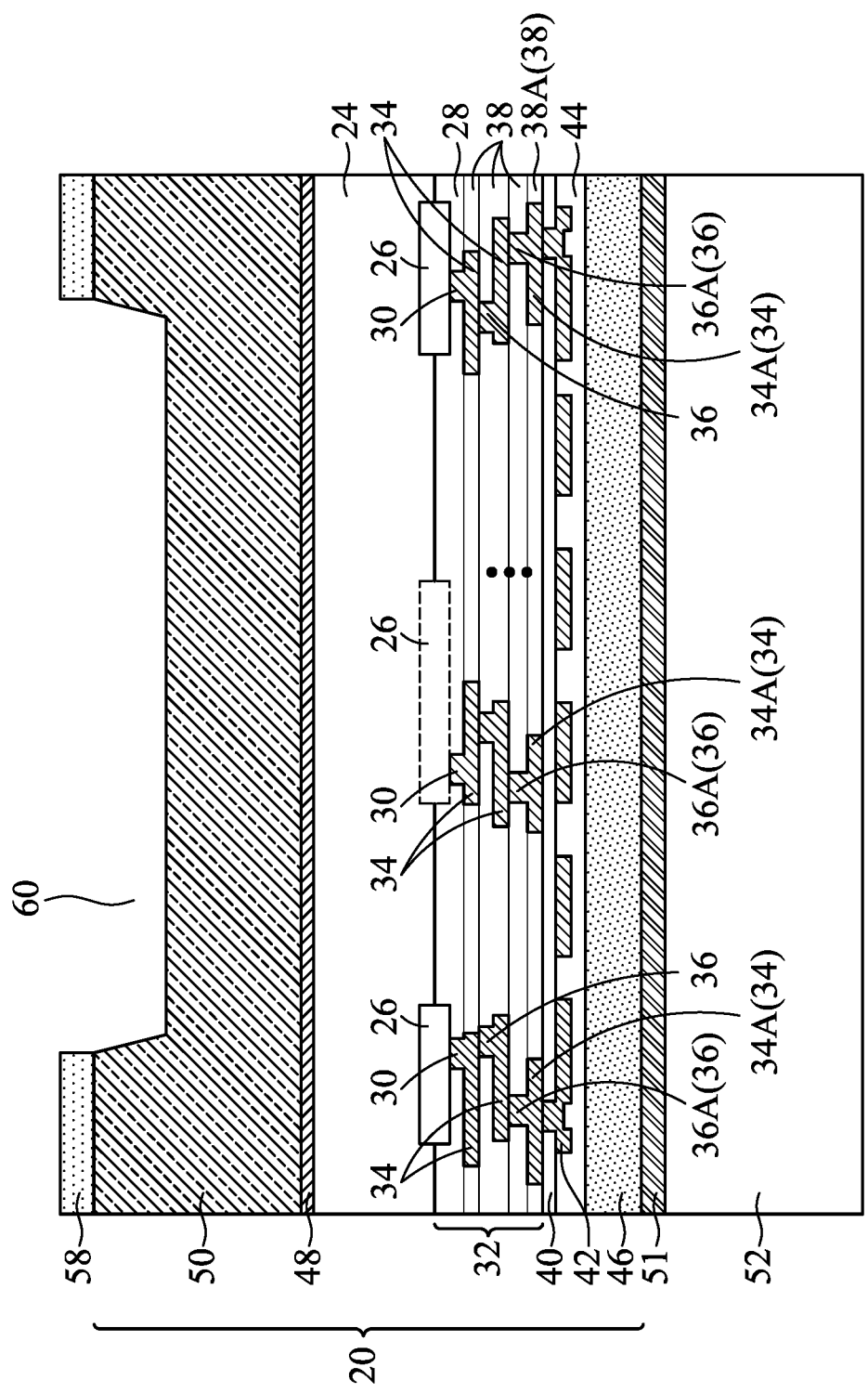

FIGS. 6 through 12 illustrate the formation processes of opening 60 (FIG. 12), which penetrates through supporting substrate 50 and bonding layer 48, and extends into semiconductor substrate 24. The etching processes may include Reactive Ion Etching (RIE) processes, in which plasma is generated, and ions are generated from the etching gases. FIGS. 6 through 10 illustrate the formation of opening 60 in supporting substrate 50, so that bonding layer 48 is revealed. The respective process is illustrated as process 218 in the process flow 200 as shown in FIG. 24. Referring to FIG. 6, etching mask 58 is formed. Etching mask 58 may include a hard mask formed of TiN, TaN, BN, SiN, SiON, SiCN, SiOCN, or the like. The formation process may include ALD, PECVD, or the like. Etching mask 58 may be patterned by using a patterned photo resist, which is removed after etching mask 58 is patterned. Next, supporting substrate 50 is etched. In accordance with some embodiments in which supporting substrate 50 is a silicon substrate, the etching is performed using process gases selected from, and not limited to, $SF_6$, $CF_4$, $C_4F_8$, $O_2$, Ar, and/or the like, and combinations thereof. The etching time may be in the range between about 0.15 seconds and about 3 seconds. The etching of supporting substrate 50 may be performed with a pressure in the range between about 15 mTorr and about 50 mTorr. The flow rate of the process gases may be in the range between about 150 sccm and about 500 sccm. An RF source power is applied, and the RF source power may be in the range between about 1,200 Watts and about 5,000 Watts. A bias power in the range between about 50 Watts and about 300 Watts may also be applied. The etching may be isotropic. Accordingly, opening 60 is controlled to be shallow so that opening 60 does not extend directly underlying etching mask 58.

Figure 7:
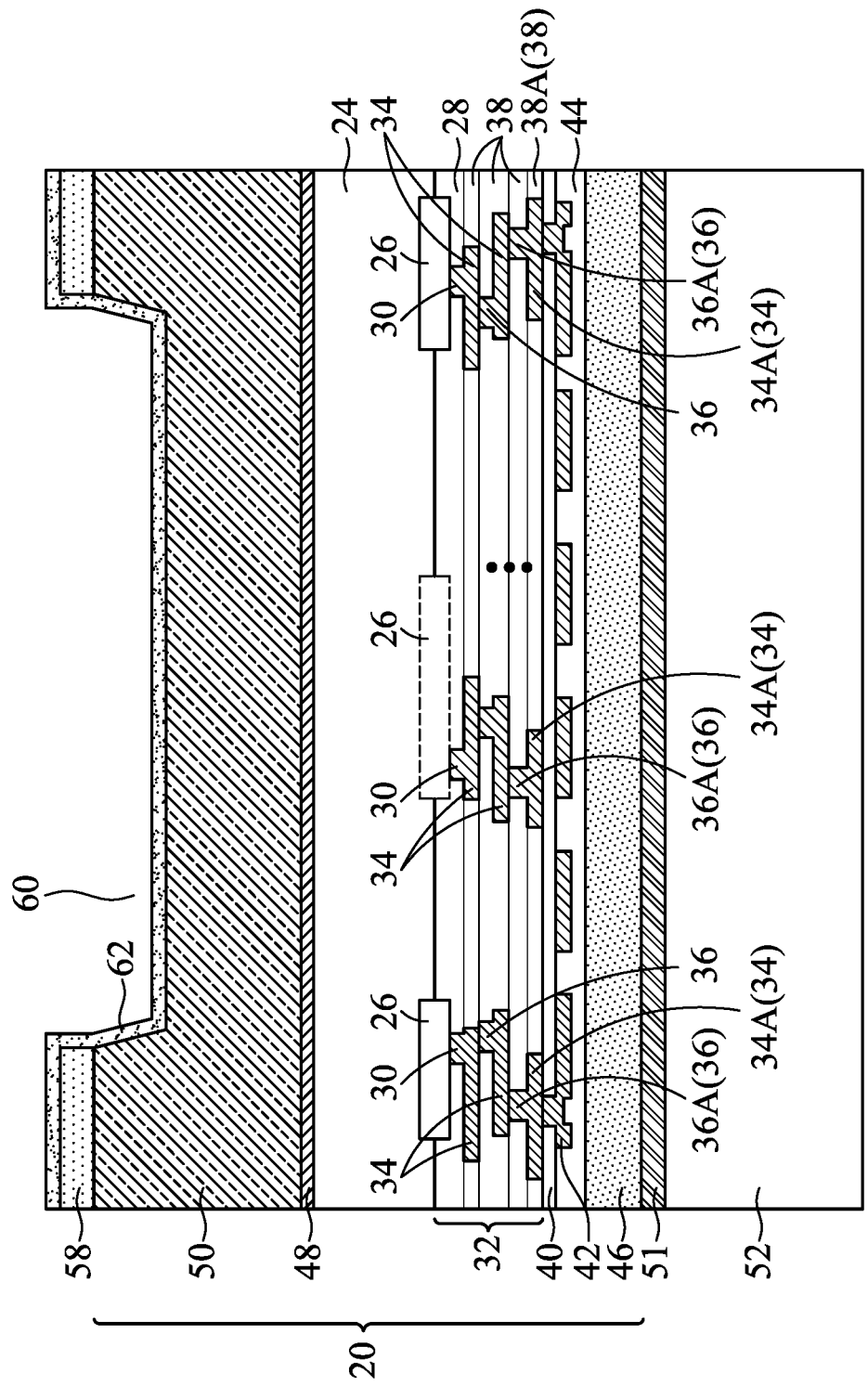
Figure 8:
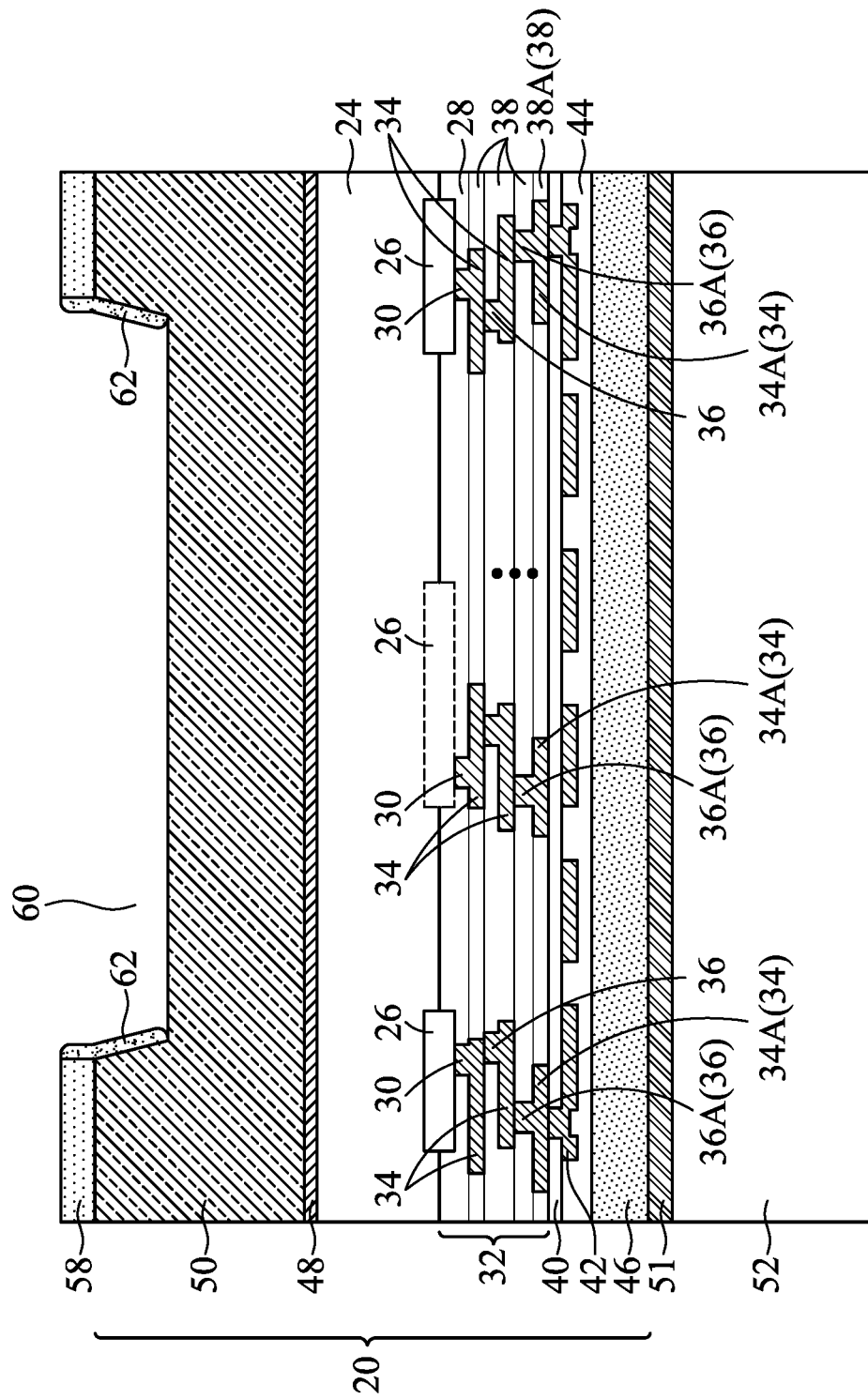
Figure 9:
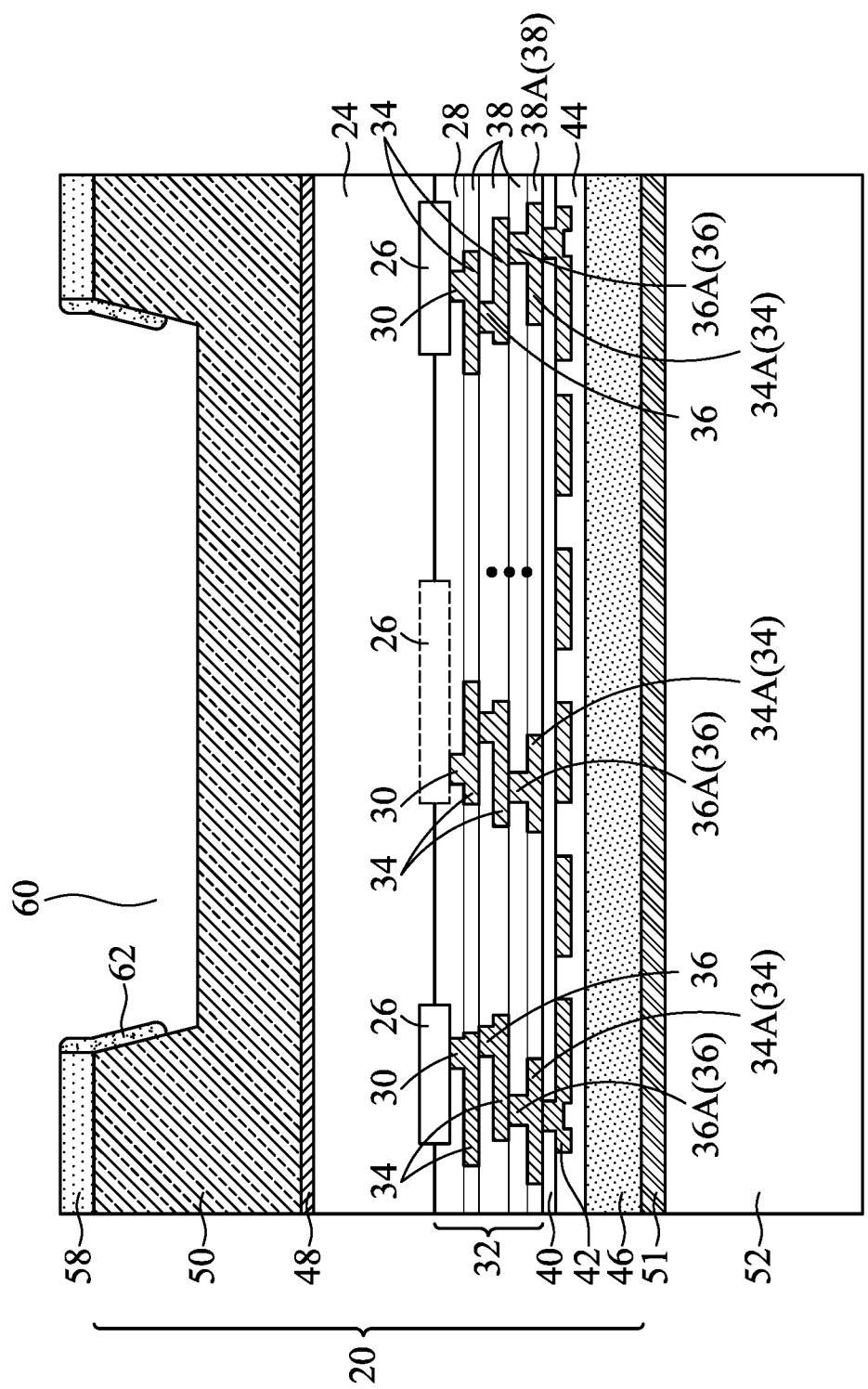

In subsequent processes, as shown in FIGS. 7 through 10, a plurality of etching cycles are performed to extend opening 60 down to penetrate through supporting substrate 50. The respective etching process is also referred to as a Bosch etching process, which is configured to create deep trenches with straight sidewalls. FIGS. 7 through 9 illustrate a deposition-etching cycle.

Referring to FIG. 7, a deposition process is performed to deposit polymer layer 62. The deposition is performed using process gases selected from, and not limited to, $CF_4$, $C_4F_8$, and/or the like, and combinations thereof. The deposition time may be in the range between about 0.15 seconds and about 2 seconds. The deposition of polymer layer 62 may be performed with a pressure in the range between about 15 mTorr and about 50 mTorr. The flow rate of the process gases may be in the range between about 150 sccm and about 500 sccm. An RF source power is applied, and the RF source power may be in the range between about 1,200 Watts and about 5,000 Watts. There may not be any bias power applied or a low bias power may be applied. Polymer layer 62 may comprise carbon, hydrogen, oxygen, and the like. Polymer layer 62 may be a conformal layer.

FIG. 8 illustrates the self-aligned patterning of polymer layer 62, which is achieved through an anisotropic etching process. In accordance with some embodiments, the etching is performed using process gases selected from, and not limited to, $SF_6$, $CF_4$, $C_4F_8$, $O_2$, Ar, and/or the like, and combinations thereof. The etching time may be in the range between about 0.15 seconds and about 3 seconds. The etching process may be performed with a pressure in the range between about 15 mTorr and about 50 mTorr. The flow rate of the process gases may be in the range between about 150 sccm and about 500 sccm. An RF source power is applied, and the RF source power may be in the range between about 1,200 Watts and about 5,000 Watts. A bias power in the range between about 400 Watts and about 700 Watts may also be applied.

As a result of the self-aligned patterning process, polymer layer 62 includes sidewall portions on the sidewalls of supporting substrate 50 to protect the sidewalls, so that the upper portions of opening 60 are not laterally expanded when the opening 60 is extended downwardly in a subsequent etching process.

Referring to FIG. 9, an etching process is performed to extend opening 60 deeper into supporting substrate 50. The etching may be performed using process gases selected from, and not limited to, $SF_6$, $CF_4$, $C_4F_8$, $O_2$, Ar, and/or the like, and combinations thereof. The etching time may be in the range between about 0.15 seconds and about 3 seconds. The etching process may be performed with a pressure in the range between about 15 mTorr and about 50 mTorr. The flow rate of the process gases may be in the range between about 150 sccm and about 500 sccm. An RF source power is applied, and the RF source power may be in the range between about 1,200 Watts and about 5,000 Watts. A bias power in the range between about 50 Watts and about 300 Watts may also be applied. The etching is stopped when opening 60 extends down slightly, and is ended before trench extends directly underlying etching mask 58, so that opening 60 has straight edges. The bottom of opening 60 is also planar. Since the bias power is low, there is substantially no shading effect, as will be discussed in detail in subsequent paragraphs.

Figure 10:
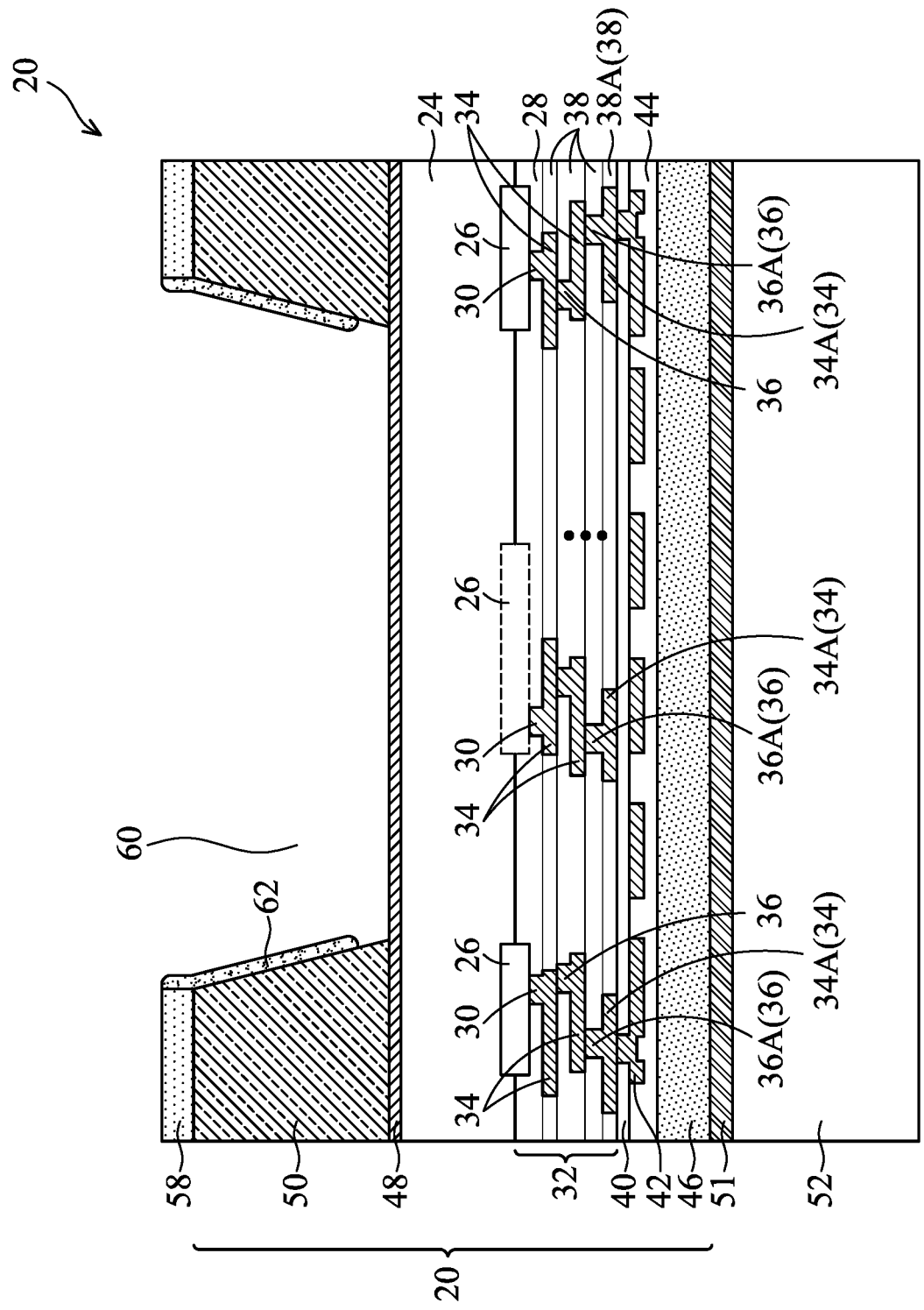

In accordance with some embodiments, the etching of supporting substrate 50 includes a plurality of deposition-etching cycles, each including a polymer-deposition process (as shown in FIG. 7), a self-aligned patterning process (as shown in FIG. 8), an etching process to extend opening 60 down (as shown in FIG. 9). The polymer layer 62 formed in the previous cycle may be removed or may be left for the next cycle. FIG. 10 illustrates that an additional cycle(s) has been performed to further form polymer layer 62 extending down. Each of the deposition-etching cycles results in opening 60 to extend further down, until supporting substrate 50 is etched-through, and opening 60 extends to bonding layer 48, which acts as an etch stop layer. After the last etching process, no more polymer layer is deposited, and hence in FIG. 10, the bottom ends of polymer layer 62 are higher than the bottom of opening 60. Polymer layer 62 may be removed at this time, or alternatively, at a time after the formation of opening 60 is finished, as shown in FIG. 12.

Figure 11:
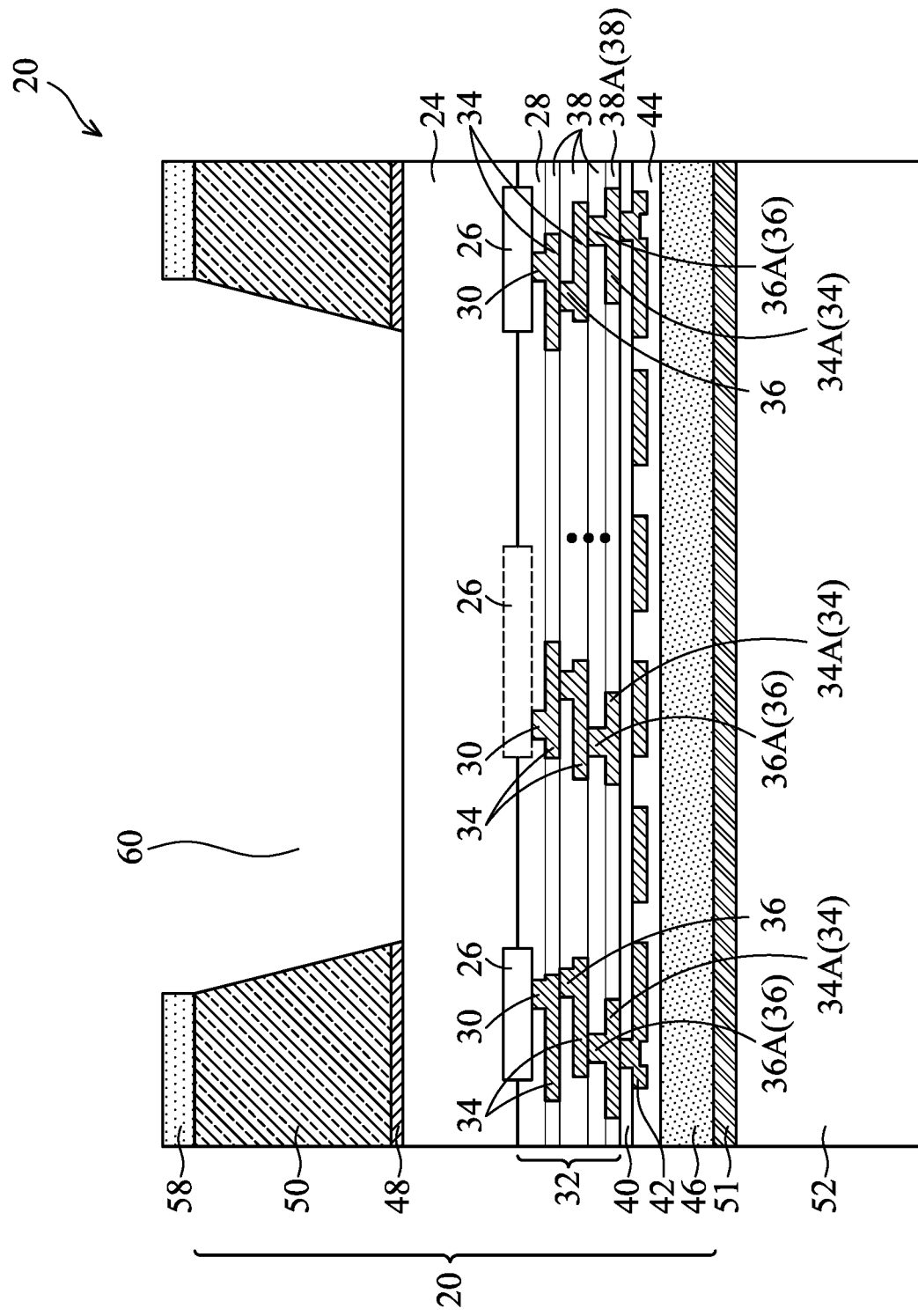

Referring to FIG. 11, bonding layer 48 is etched. The respective process is illustrated as process 220 in the process flow 200 as shown in FIG. 24. The etching may be anisotropic or anisotropic, and may be performed through a wet etching process or a dry etching process.

Figure 12:
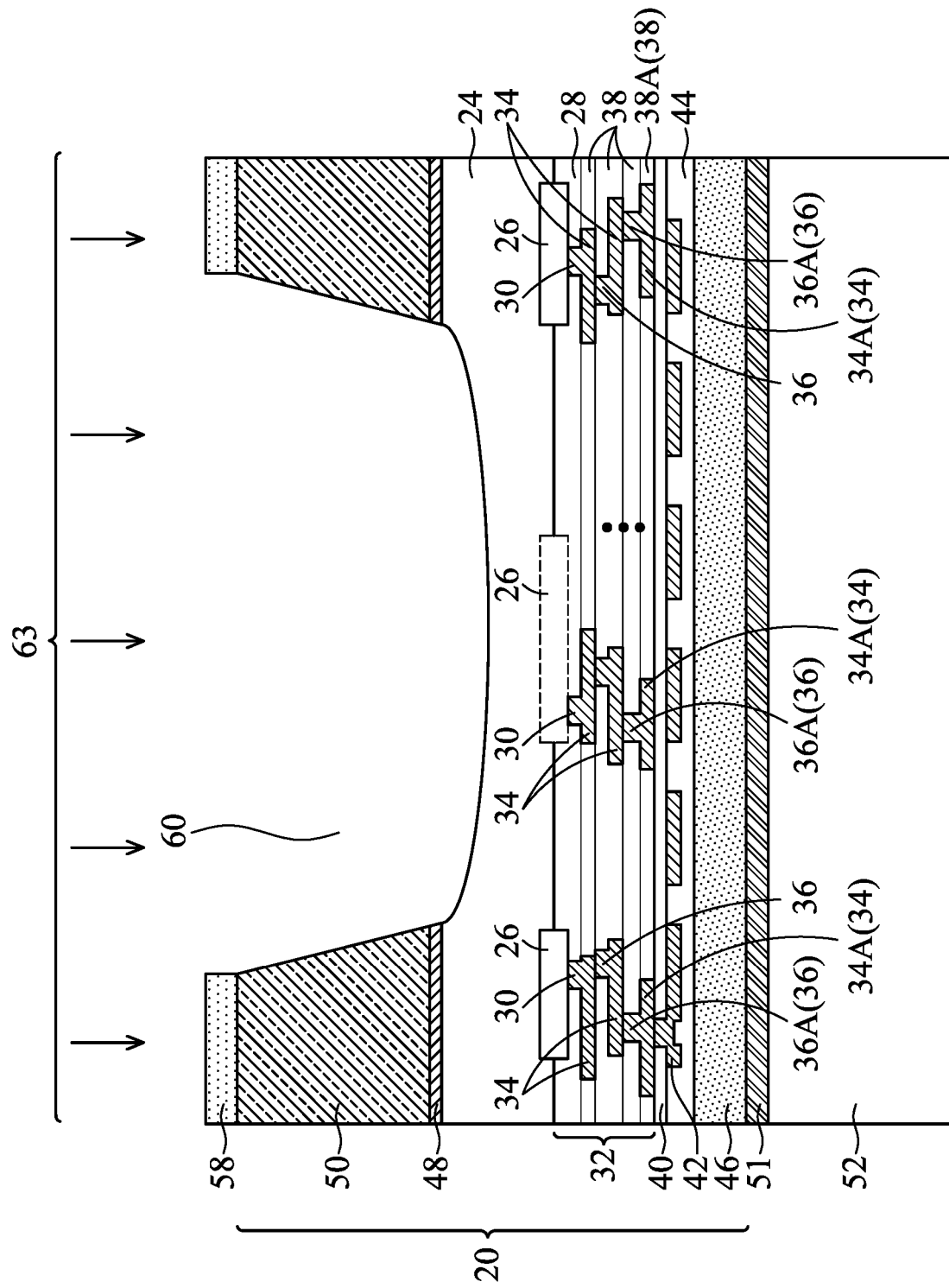

Next, as shown in FIG. 12, etching process 63 is performed to etch semiconductor substrate 24, so that opening 60 further extends into semiconductor substrate 24, with a bottom part of opening 60 being curved. The respective process is illustrated as process 222 in the process flow 200 as shown in FIG. 24. In accordance with some embodiments, the etching is performed through RIE. The etching may be performed using process gases selected from, and not limited to, $SF_6$, $CF_4$, $C_4F_8$, $O_2$, Ar, and/or the like, and combinations thereof. The etching time may be in the range between about 0.15 seconds and about 3 seconds. The etching process may be performed with a pressure in the range between about 15 mTorr and about 50 mTorr. The flow rate of the process gases may be in the range between about 150 sccm and about 500 sccm. An RF source power is applied, and the RF source power may be in the range between about 1,200 Watts and about 5,000 Watts.

In the etching process, a bias power higher than the bias power used in the etching of supporting substrate 50 may be used. For example, in etching process 63, the bias power may be in the range between about 500 Watts and about 1,200 Watts. The etching may be anisotropic. The etching may be performed through a continuous etching process without breaking in between, and without the formation of polymer and the cycles as shown in FIGS. 7 through 9. Since the opening 60 may be a high-aspect-ratio opening (while figures are not be shown in scale), and that the anisotropic etching is adopted, loading effect and shielding effect occur. The regions inside opening 60 and closer to the sidewalls of supporting substrate 50 and semiconductor substrate 24 are shielded more than the regions closer to the middle between opposing sidewalls of supporting substrate 50 and semiconductor substrate 24. Accordingly, the middle regions are etched faster than the regions closer to the sidewalls. The middle regions of opening 60 thus have greater depths than the respective side portions of opening 60. The resulting opening is thus bowl-shaped, with the middle regions increasingly deeper than the respective side portions. The bottom of opening 60 is also continuous curved. On the other hand, the sidewalls of supporting substrate 50 facing opening 60 are straight, and may be slanted or vertical. As a comparison, in the etching of supporting substrate 50, since Bosch (and isotropic) etching process is adopted, there is substantially no shielding effect, and hence the bottom of the corresponding opening 60 is planar, and edges are straight.

In a subsequent process, carrier 52 is de-bonded from the overlying wafer 20. The respective process is illustrated as process 224 in the process flow 200 as shown in FIG. 24. The de-bonding process may include projecting a light beam such as a laser beam on release film 51, so that release film 51 is decomposed and releasing wafer 20 from carrier 52. In a subsequent process, hard mask plate 46, bonding layer 44, and barrier layer 42 may be removed, for example, through a grinding process, or a laser lifting process followed by an etching process.

FIG. 13 illustrates a process for forming a capacitor on wafer 20 in accordance with some embodiments. The respective process is illustrated as process 226 in the process flow 200 as shown in FIG. 24. Conductive pads 64A and 64B may be formed first. In accordance with some embodiments, conductive pads 64A and 64B are formed of aluminum copper, copper, tungsten, or the like. The formation process may include PVD, plating, and/or the like. Conductive pads 64A and 64B may be electrically connected to integrated circuit devices 26. Metal pads 66A and 66B may be formed on conductive pads 64A and 64B, respectively, and are formed of conductive materials such as copper, nickel, palladium, or the like. Back-plate 70 is formed on or bonded to conductive pads 64B. In accordance with some embodiments, back-plate 70 is formed of a conductive material, which may be a metallic material or polysilicon. Back-plate 70 is electrically disconnected from conductive pad 64A by dielectric layer 74, which may be formed of silicon oxide, silicon nitride, silicon carbide, silicon oxynitride, or the like. Through-openings 76 are formed in back-plate 70, and are connected to air gap 78, which separates back-plate 70 from conductive pad 64A. Accordingly, capacitor 80 is formed, which includes conductive pad 64A and back-plate 70 as capacitor plates, and air gap 78 as the capacitor insulator. The formation of air gap 78 may include forming a sacrificial material, on which back-plate 70 is deposited. The back-plate 70 is patterned to form openings 76, and the sacrificial material is removed through through-openings 76 to form air gap 78. Metal pads 66A and 66B may be used to connect to external devices, for example, by bonding to an external device (not shown) through solder bonding, with solder regions joining to metal pads 66A and 66B and the metal pads of the external device. Alternatively, wire bonds, which may include wire bond studs and wires, are connected to metal pads 66A and 66B.

In accordance with some embodiments, the structure shown in FIG. 13 is singulated through scribe lines 82, so that a plurality of dies 84 are formed. The plurality of dies 84 may be identical to each other, with each comprising one or more capacitor 80. In the resulting capacitor 80, the portions of substrate 24 and the overlying structures that are between opening 60 and air gap 78 form a membrane, which is capable of vibrating under mechanical force or the voltages applied to metal pads 66A and 66B.

As shown in FIG. 13, opening 60 has a portion in semiconductor substrate 24, which portion is arched. The height HA1 of the arch, which height is equal to the difference between the edge thickness ET1 and center thickness CT1 of wafer 20, may be in the range between about 15 μm and about 50 μm. The ratio of thickness CT1/ET1 may be in the range between about 0.7 and about 0.95. The overall thickness H2 of the structure may be in the range between about 720 μm and about 780 μm. Thickness H2 includes the center height CT1 of membrane and the height of opening 60. The bottom width BW1 (which may be a diameter) of opening 60 may be in the range between about 17.8 mm and about 25 mm. Thickness T3 of bonding layer 48 may be in the range between about 1 μm and about 5 μm. The bottom width BW2 (which may be a diameter) of the arched portion of opening 60 in semiconductor substrate 24 may be in the range between about 15 mm and about 25 mm. Ratio HA1/BW2 may be in the range between about 0.0001 and about 0.003. Opening 60 may have a top or bottom view shape of a circle, a rectangle, a hexagon, or the like.

In accordance with some embodiments, by forming the arched opening 60, the edge portions of the membrane are increasingly thicker, and hence the membrane is stronger, and does not suffer from collapsing problems. Also, the overall warpage of the entire die 84 and wafer 20 is reduced since thicker edge portions of the membrane provide better ability for resisting die warpage and stress.

FIGS. 14 through 23 illustrate the cross-sectional views of intermediate stages in the formation of a device in accordance with alternative embodiments of the present disclosure. Unless specified otherwise, the materials and the formation processes of the components in these embodiments are essentially the same as the like components, which are denoted by like reference numerals in the preceding embodiments shown in FIGS. 1 through 13. The details regarding the formation process and the materials of the components shown in FIGS. 14 through 23 may thus be found in the discussion of the preceding embodiments.

Figure 14:
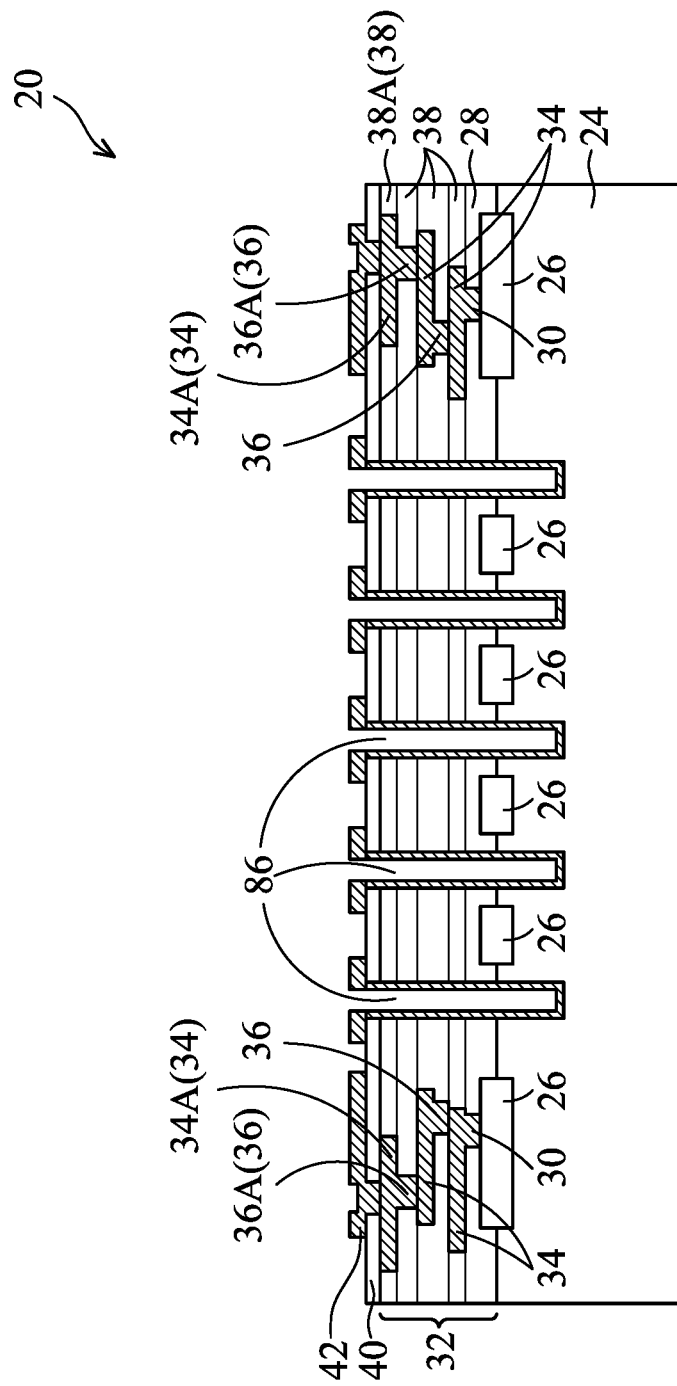
FIGS. 14 through 23 illustrate the cross-sectional views of intermediate stages in the formation of a MEMS device having an arched opening and through-openings in accordance with some embodiments.

Referring to FIG. 14, wafer 20 is formed. The initial structure and the formation processes of wafer 20 in accordance with these embodiments are similar to the embodiments as shown in FIG. 1, except that a plurality of openings 86 are formed to penetrate the dielectric layers over semiconductor substrate 24. Openings 86 also extend into semiconductor substrate 24. In accordance with some embodiments, barrier layer 42 is formed after the formation of openings 86, and barrier layer 42 extends into openings 86. A dielectric layer (not shown), may be formed before the formation of barrier layer 42, and extends into openings 86 to electrically isolate barrier layer 42 from substrate 24. When viewed in a top view of wafer 20 and device dies 22, openings 86 may form a repeated pattern such as an array, a beehive pattern (hexagonal pattern), or the like. Integrated circuit devices 26 may be formed in the spaces between openings 86, and in the regions surrounding openings 86.

Figure 15:
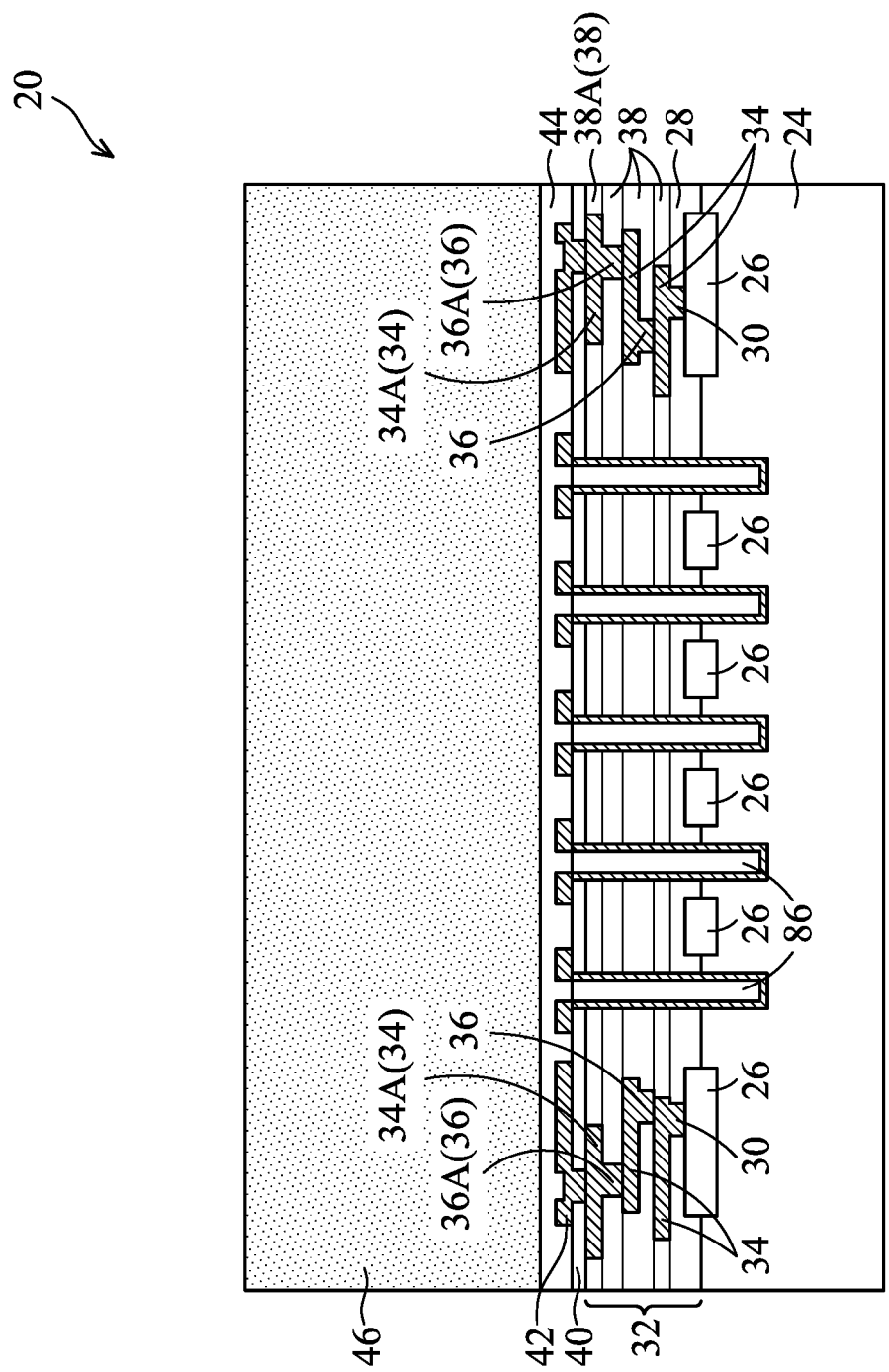

Referring to FIG. 15, bonding layer 44 is deposited, which may include a silicon-containing material (which may be a dielectric material) such as $SiO_2$, SiN, SiC, SiON, SiOCN, or the like. A planarization process is then performed to level the top surface of bonding layer 44. Hard mask plate 46, which may include or formed of a silicon substrate, is bonded to bonding layer 44 through fusion bonding.

Figure 16:
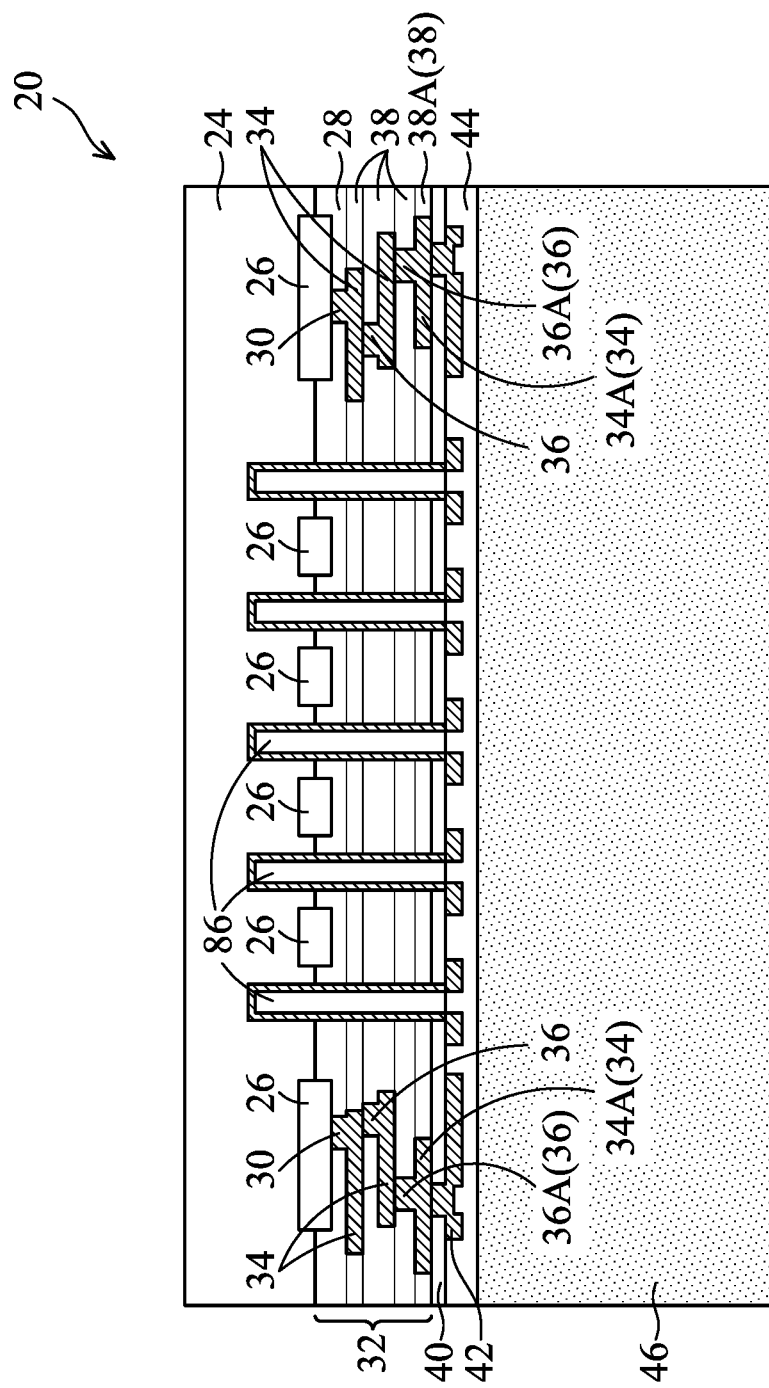

FIG. 16 illustrates the flipping of the structure as shown in FIG. 15, followed by the thinning of semiconductor substrate 24 to a desirable thickness, which is suitable for forming an arch with a desirable height.

Figure 17:
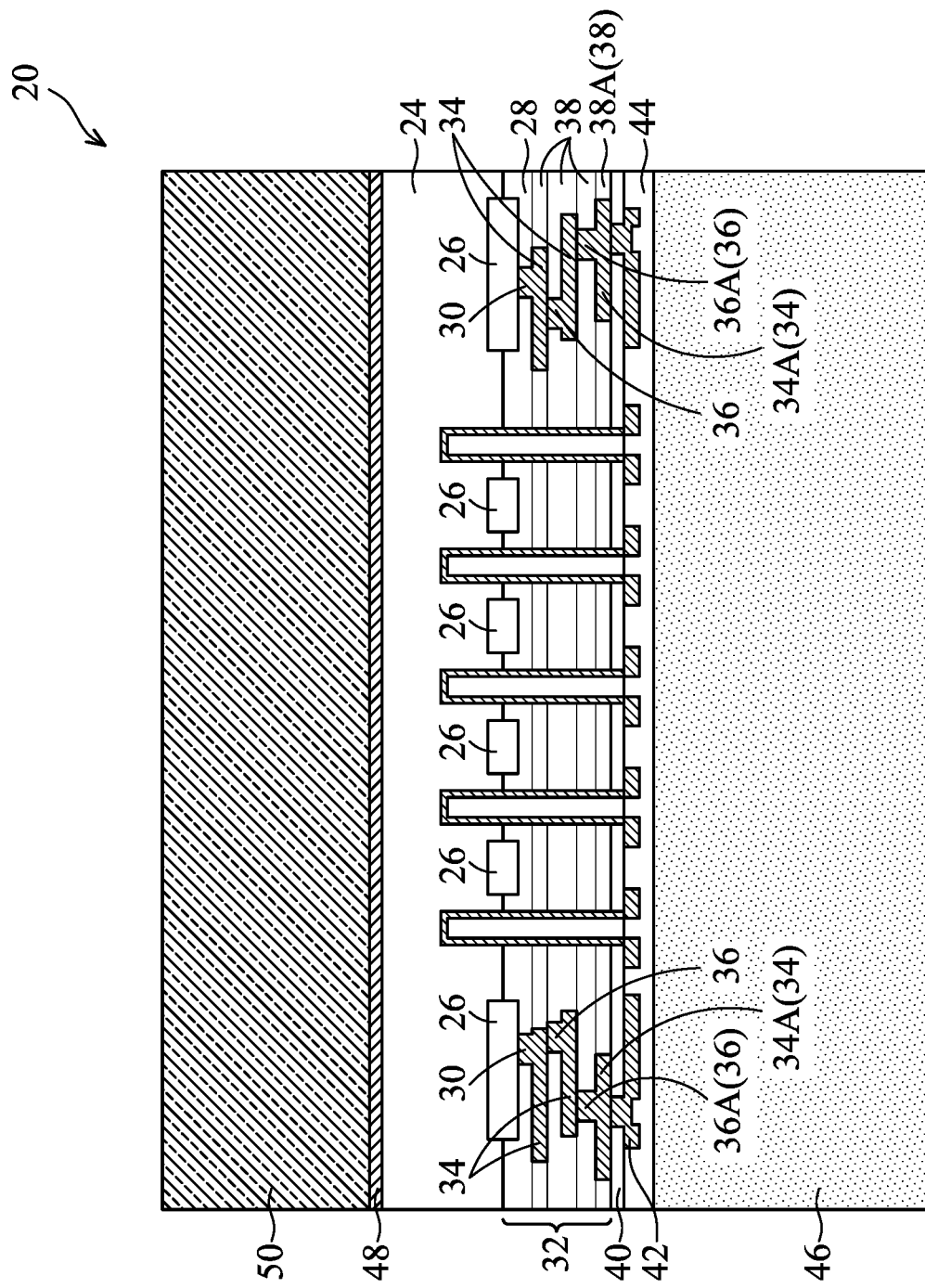
Figure 18:
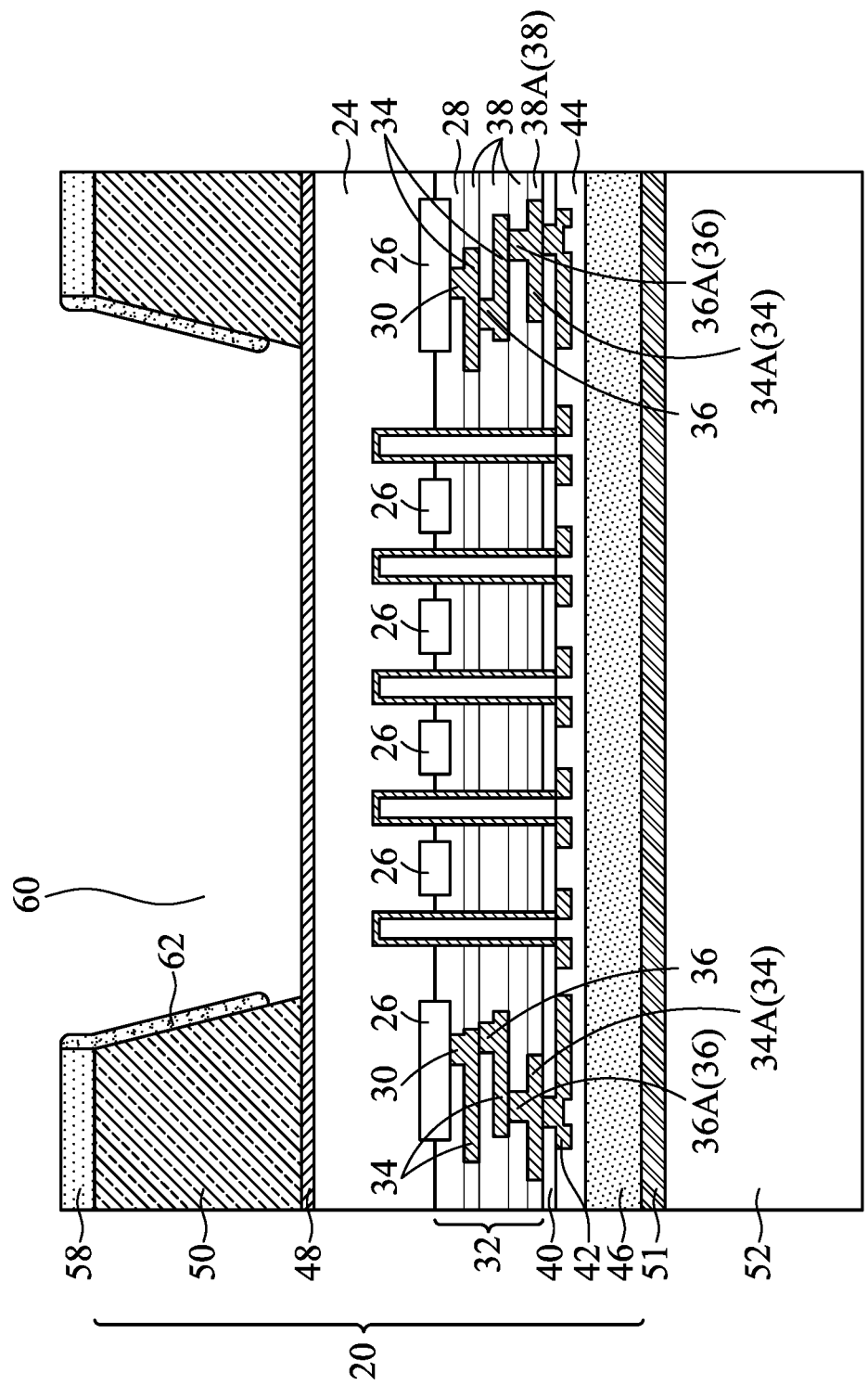

Next, as shown in FIG. 17, supporting substrate 50 is bonded to semiconductor substrate 24 through bonding layer 48, which also acts as an etch stop layer in subsequent etching processes. Supporting substrate 50 is then etched to form opening 60, as shown in FIG. 18. The etching process may include a Bosch etching process including a plurality of etching processes, as discussed in preceding embodiments. Polymer layer 62 is formed to assist the etching and to help to form vertical sidewalls for opening 60. The details of the processes are essentially the same as discussed referring to FIGS. 7 through 10, and are not repeated herein. Bonding layer 48, which is an etch stop layer for stopping the etching of supporting substrate 50, is exposed.

Figure 19:
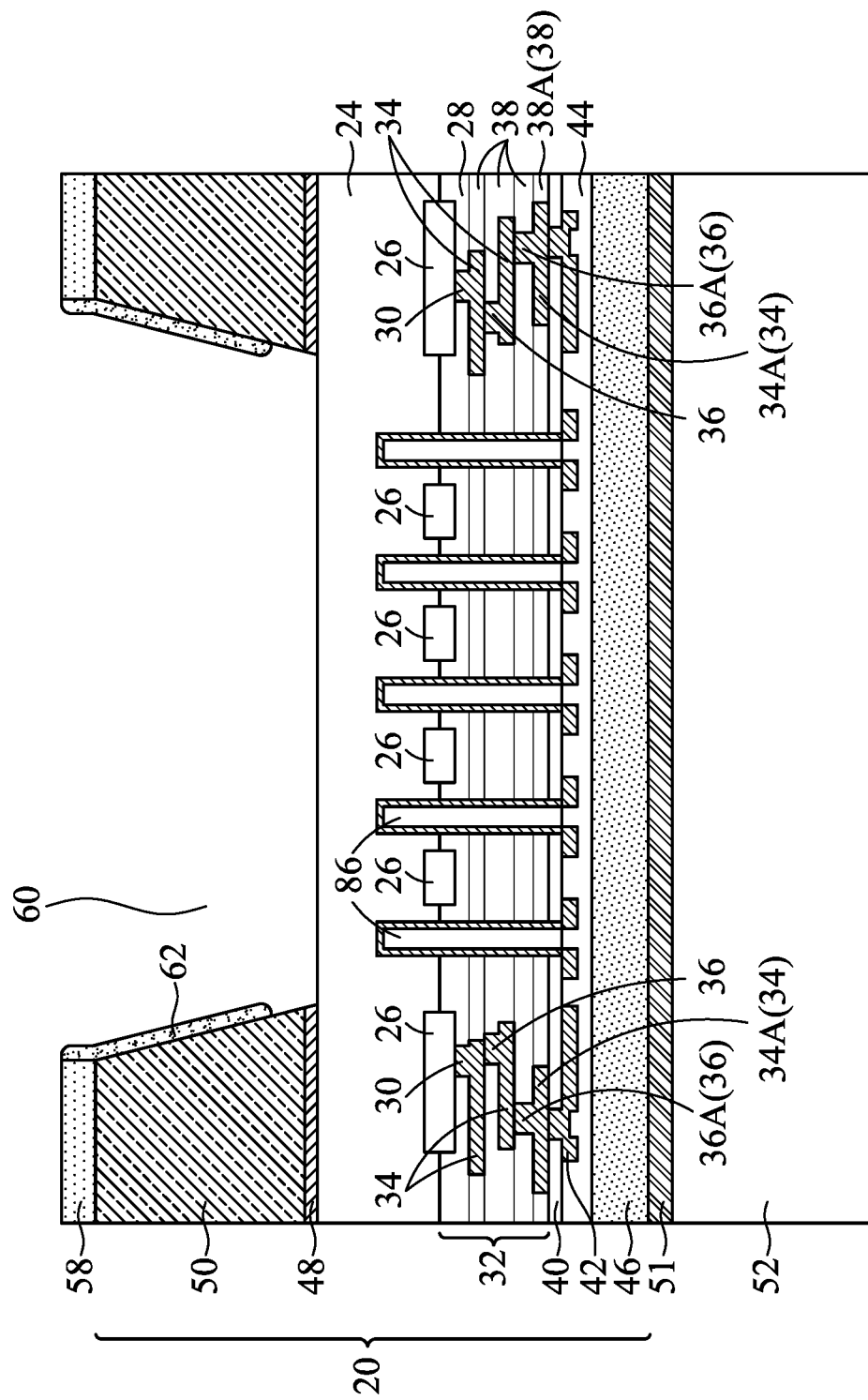
Figure 20:
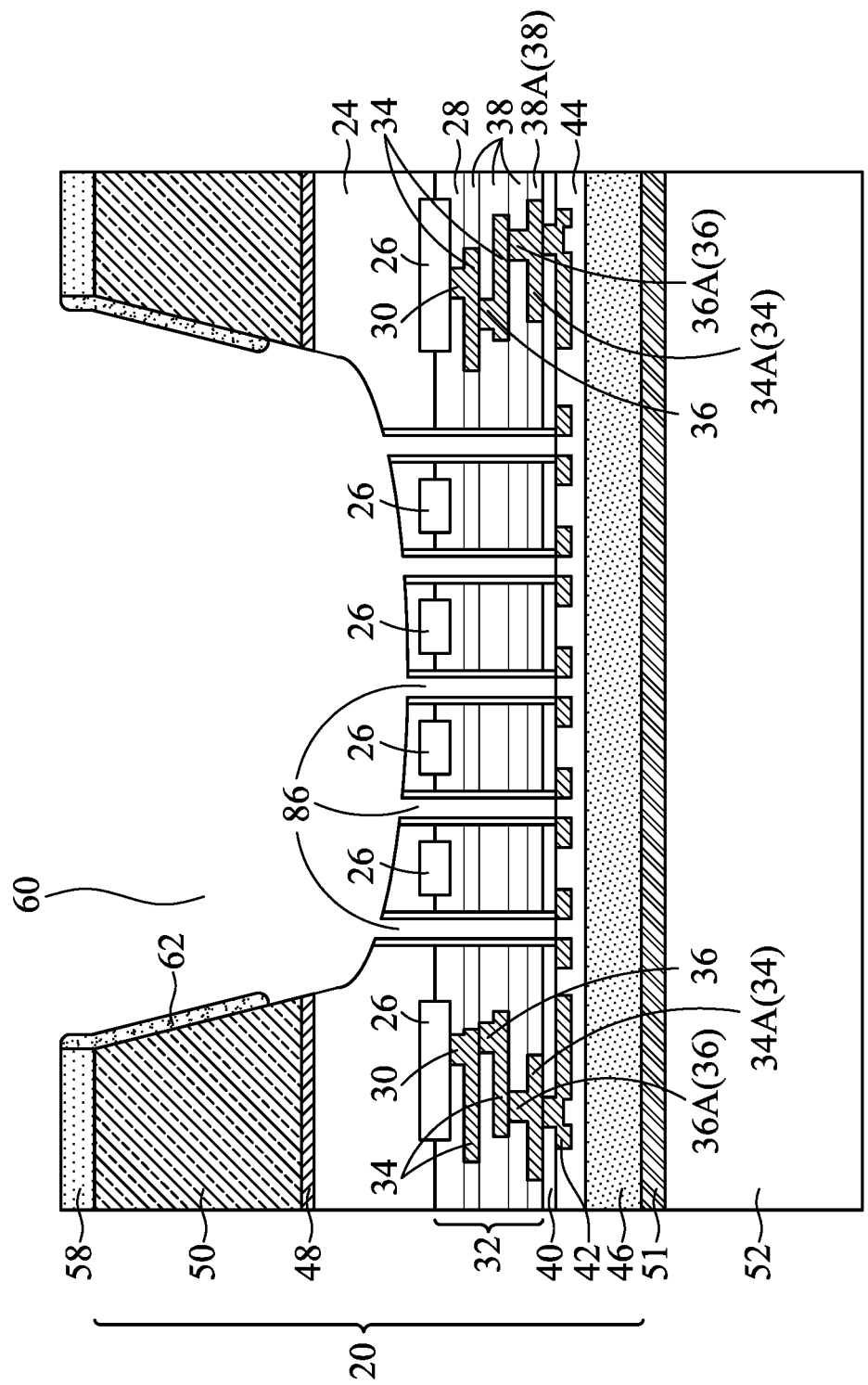

Referring to FIG. 19, bonding layer 48 is etched-through, either through a dry etching process or a wet etching process. Next, a continuous etching process is performed to etch semiconductor substrate, during which loading effect and shading effect are incurred, so that the bottom of opening 60 is curved (arched when viewed upside down).

The etching process may be similar to what has been discussed referring to FIG. 12, and hence the details of the etching process not repeated. In accordance with some embodiments, the etching gas, in addition to the etching gas for etching semiconductor substrate 24, may also include an etching gas configured to etching barrier layer 42, so that with the proceeding of the etching of semiconductor substrate, the exposed portions of barrier layer 42 are also etched. For example, a small amount of chlorine-containing gas such as TiClx, TaClx, WClx or the like may be added into the etching gas to etch barrier layer 42. In accordance with alternative embodiments, since barrier layer 42 is thin, the argon in the etching gas may remove the exposed barrier layer 42 through sputtering. After the etching process, polymer layer 62, if any, is removed. Due to the arched shape of opening 60, the membrane, which is the part of substrate directly under opening 60, is stronger, and can withstand higher stress without collapsing. Furthermore, the resulting device 94 (FIG. 23) has less warpage.

Figure 21:
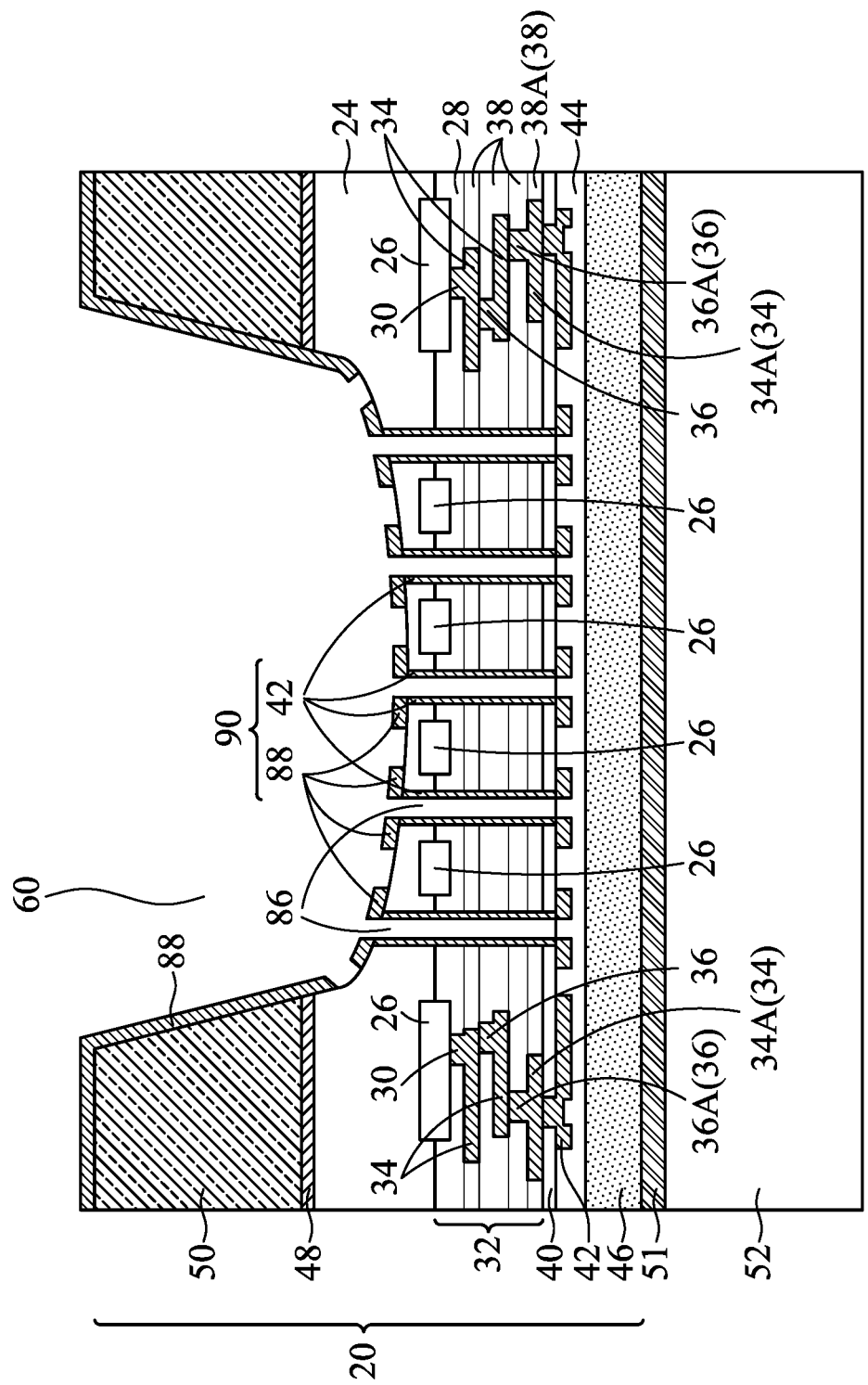

FIG. 21 illustrates the formation of a patterned conductive layer 88, which may cover some of the exposed surfaces of supporting substrate 50, bonding layer 48, and semiconductor substrate 24. Conductive layer 88 may be formed of tungsten, aluminum, aluminum copper, or the like, and may be formed through PVD, for example. A dielectric layer (not shown), may be formed before the formation of conductive layer 88, and electrically isolates conductive layer 88 from substrate 24. After the deposition, conductive layer 88 is patterned. The remaining portions of conductive layer 88 may include a plurality of separated portions, each joined to and connected to the portion of barrier layer 42 in one opening 86. Throughout the description, the portions of barrier layer 42 and their connecting portions of conductive layer 88 are collectively referred to as conductive pipes 90. The portions of conductive layer 88 in different conductive pipes 90 are physically separated from each other and electrically disconnected from each other, so that each conductive pipe 90 may individually be applied with a voltage.

Figure 22:
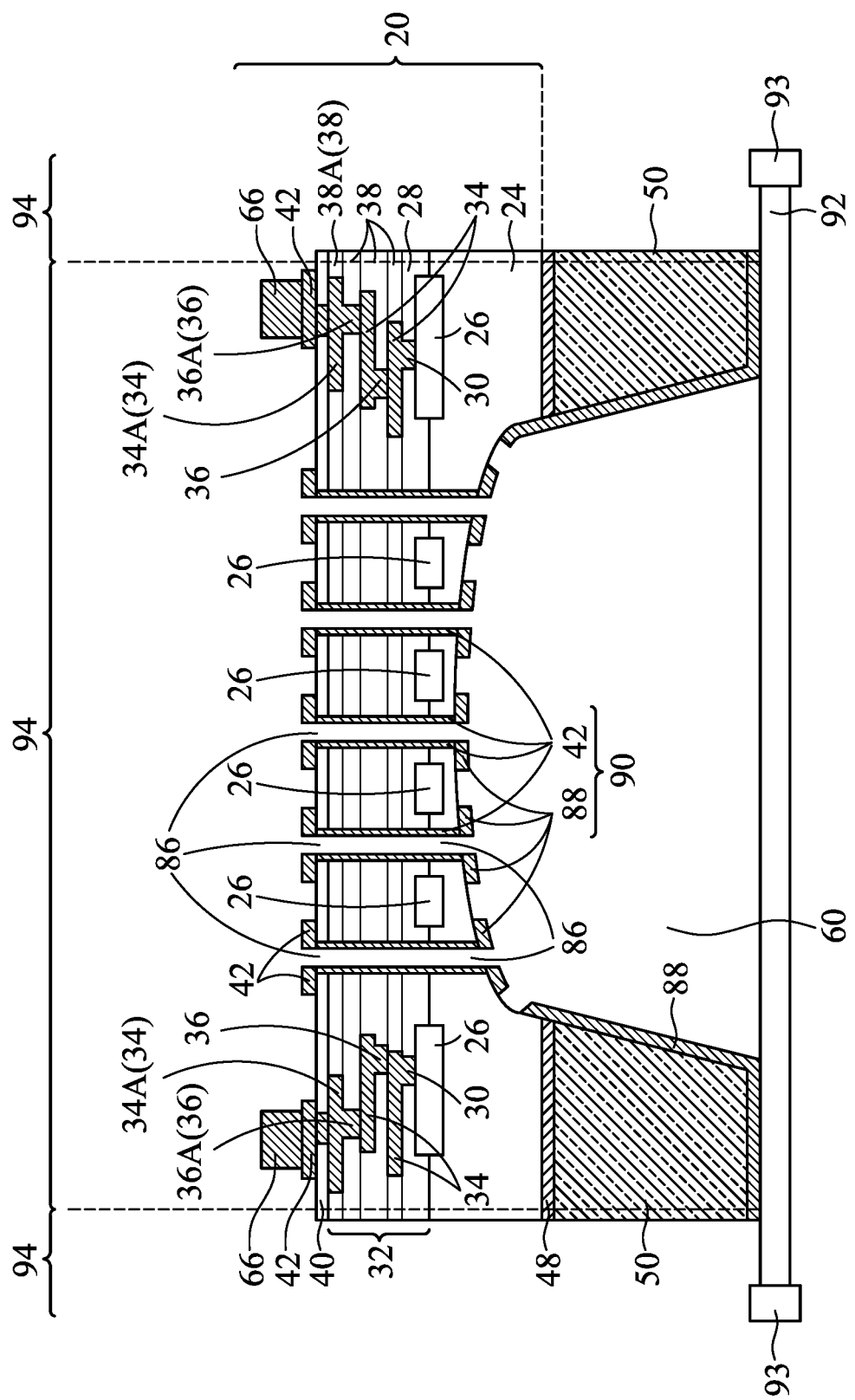

The structure shown in FIG. 21 is then flipped upside down, and carrier 52 is de-bonded to its overlying structure. The resulting structure is shown in FIG. 22. Hard mask plate 46 and bonding layer 44 are then removed. The resulting structure is shown in FIG. 22. Next, the structure is placed over dicing tape 92, which is fixed on frame 93. Bonding pads 66 may be formed to electrically connect to the integrated circuit devices 26. Next, a singulation process may be performed to saw the structure shown in FIG. 22. Device(es) 94 are thus formed. In accordance with alternative embodiments, the structure is not singulated. In accordance with yet alternative embodiments, the structure is trimmed to remove edge portions not including any integrated circuit devices 26 and opening 86, while the portion including integrated circuit devices 26 and opening 86 are left.

Figure 23:
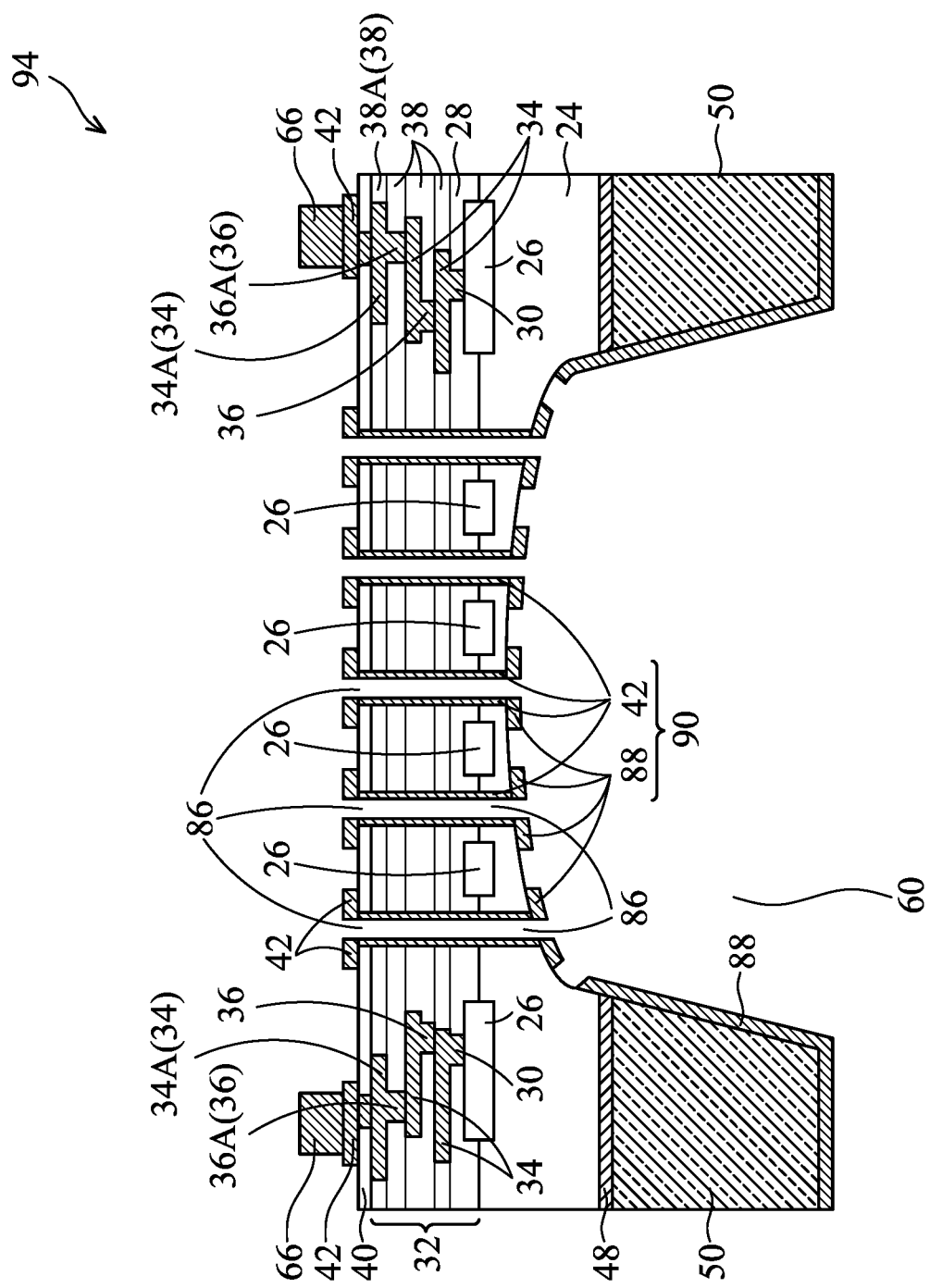

FIG. 23 illustrates a resulting device 94. Solder bonding or wire bonding may be performed to electrically connect an external device to device 94, which external device may include a voltage controller, for example. In accordance with some embodiments, the conductive pipes 90 are electrically connected to integrated circuit devices 26, and are configured to apply desirable voltages. Accordingly, each of conductive pipes 90 may be individually applied (through the voltage controller) with a voltage. The device 94 may be used for forming lithography masks. For example, a blank lithography mask (not shown) may be placed under device 94. An eBeam source may be placed over device 94 and projects an eBeam. Voltages may be applied through bond pads 66 to integrated circuit devices 26. The voltages are provided to conductive pipes 90, so that each of conductive pipes 90 may be applied with a voltage. By controlling the voltages applied to the conductive pipes 90, each of conductive pipes 90 may be used as a switch allowing the eBeam to pass through, or blocking eBeam from passing through. The underlying blank lithography mask is thus patterned by the eBeam to have a desirable pattern. A patterned lithograph mask is thus formed.

The embodiments of the present disclosure have some advantageous features. By adjusting etching processes in the formation of an opening in device 94, the opening under the formed membrane is arched. The membrane thus has a thin center portion that is sensitive, and edges portions being thick. The mechanical strength of the membrane is improved, and the corresponding membrane is more immune to the collapsing problem. The warpage of the corresponding device is also reduced.

In accordance with some embodiments of the present disclosure, a method comprises bonding a supporting substrate to a semiconductor substrate of a wafer, wherein a bonding layer is between, and is bonded to both of, the supporting substrate and the semiconductor substrate; performing a first etching process to etch the supporting substrate and to form an opening, wherein the opening penetrates through the supporting substrate and stops on the bonding layer, and wherein the opening has substantially straight edges; etching-through the bonding layer; and performing a second etching process to extend the opening down into the semiconductor substrate, wherein a bottom portion of the opening is curved. In an embodiment, the method further comprises forming a conductive layer overlapping the opening, with a portion of the semiconductor substrate being between the opening and the conductive layer; and forming a conductive back-plate overlapping the conductive layer and the opening, wherein the conductive back-plate and the conductive layer are separated from each other by an air gap, and the conductive layer, the air gap, and the conductive back-plate collectively form a capacitor. In an embodiment, the first etching process comprises a plurality of etching cycles, and each of the plurality of etching cycles comprises forming a polymer layer extending into the opening; removing horizontal portions of the polymer layer, wherein vertical portions of the polymer layer are in the opening and cover sidewalls of the supporting substrate; and etching the supporting substrate using the vertical portions of the polymer layer as an etching mask. In an embodiment, the etching the supporting substrate is isotropic. In an embodiment, after each of the plurality of etching cycles, the opening has a planar bottom surface. In an embodiment, the first etching process comprises isotropic etching processes, and the second etching process is anisotropic. In an embodiment, the first etching process is performed using a first bias power, and the second etching process is performed using a second bias power greater than the first bias power. In an embodiment, the method further comprises, before the bonding the supporting substrate to the semiconductor substrate, etching the wafer to form a plurality of openings, wherein the plurality of openings penetrate through a plurality of dielectric layers and extend into the semiconductor substrate, and wherein after the opening extends into the semiconductor substrate, the plurality of openings are joined to the opening. In an embodiment, the method further comprises forming a plurality of conductive pipes, each extending into each of the plurality of openings. In an embodiment, the method further comprises thinning the semiconductor substrate from backside, wherein the bonding layer contacts a back surface of the thinned semiconductor substrate. In an embodiment, the second etching process is a continuous etching process without breaking therein.

In accordance with some embodiments of the present disclosure, a device comprises a semiconductor substrate; a bonding layer underlying and contacting the semiconductor substrate; a supporting substrate underlying and contacting the bonding layer; an opening extending from a bottom surface of the supporting substrate upwardly to penetrate through the bonding layer, wherein the opening further extends into the semiconductor substrate, and wherein the opening is arched; a plurality of dielectric layers over the semiconductor substrate; and integrated circuit devices at a surface of the semiconductor substrate. In an embodiment, the device further comprises a conductive layer overlapping the opening, with a portion of the semiconductor substrate being located between the opening and the conductive layer; and a conductive back-plate overlapping the conductive layer and the opening, wherein the conductive back-plate and the conductive layer are separated from each other by an air gap, and the conductive layer, the air gap, and the conductive back-plate collectively form a capacitor. In an embodiment, the device further comprises a plurality of openings penetrating through the semiconductor substrate, wherein the plurality of openings are joined to the opening. In an embodiment, a bottom surface of a portion of the semiconductor substrate facing the opening is continuously curved, with middle portions of the bottom surface increasingly higher than edge portions of the bottom surface. In an embodiment, edges of a portion of the opening in the supporting substrate are substantially straight. In an embodiment, the supporting substrate comprises a silicon substrate.

In accordance with some embodiments of the present disclosure, a device comprises a device die, which comprises a semiconductor substrate; and a plurality of dielectric layers over the semiconductor substrate, wherein portions of the semiconductor substrate and the plurality of dielectric layers form a membrane configured to vibrate, and wherein edge portions of the membrane are increasingly thicker than middle portions of the membrane. The device further comprises a bonding layer underlying and bonded to the semiconductor substrate; and a supporting substrate underlying and bonded to the bonding layer, wherein an opening is directly underlying the membrane, and extends into the semiconductor substrate and penetrates through the bonding layer and the supporting substrate. In an embodiment, the opening is arched. In an embodiment, the device further comprises a plurality of openings penetrating through the semiconductor substrate and the plurality of dielectric layers, wherein the plurality of openings are joined to the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a die comprising:
      a semiconductor substrate comprising an arched bottom surface;
      a plurality of dielectric layers over the semiconductor substrate;
      a plurality of metal lines and vias in the plurality of dielectric layers; and
      a plurality of conductive pipes penetrating through the plurality of dielectric layers and the semiconductor substrate, wherein bottoms of the plurality of conductive pipes extend to the arched bottom surface, and wherein the plurality of conductive pipes have different lengths.

2. The device of claim 1 further comprising:
   a supporting substrate; and
   a bond layer bonded between the semiconductor substrate and the supporting substrate.

3. The device of claim 2 further comprising an opening in the semiconductor substrate, the bond layer and the supporting substrate, wherein the arched bottom surface forms a top end of the opening.

4. The device of claim 3 further comprising a conductive layer on a sidewall of the supporting substrate, wherein the sidewall of the supporting substrate faces the opening, and wherein the conductive layer continuously extends from the sidewall of the supporting substrate to an addition sidewall of the semiconductor substrate.

5. The device of claim 1, wherein each of the plurality of conductive pipes comprises:
   a first portion inside the plurality of dielectric layers and the semiconductor substrate, wherein the first portion comprises an outer edge;
   a second portion overlapping the plurality of dielectric layers; and
   a third portion overlapped by the semiconductor substrate, wherein the second portion and the third portion laterally extend beyond the outer edge.

6. The device of claim 1 further comprising integrated circuit devices at a top surface of the semiconductor substrate.

7. The device of claim 6, wherein the integrated circuit devices overlap the arched bottom surface of the semiconductor substrate.

8. The device of claim 6, wherein the integrated circuit devices comprise a plurality of portions, each between two of the plurality of conductive pipes.

9. The device of claim 1, wherein the semiconductor substrate further comprises a straight sidewall underlying and connecting to the arched bottom surface.

10. The device of claim 1, wherein the plurality of conductive pipes are electrically decoupled from each other.

11. The device of claim 10, wherein the plurality of conductive pipes are configured to be applied with voltages individually.

12. A device comprising:
    a semiconductor substrate;
    a bonding layer underlying and contacting the semiconductor substrate;
    a supporting substrate underlying and contacting the bonding layer;
    an opening extending from a first bottom surface of the supporting substrate upwardly to penetrate through the bonding layer, wherein the opening further extends into the semiconductor substrate, and wherein a second bottom surface of a portion of the semiconductor substrate facing the opening is continuously curved, with middle portions of the second bottom surface increasingly higher than edge portions of the second bottom surface;
a plurality of dielectric layers over the semiconductor substrate; and
integrated circuit devices at a surface of the semiconductor substrate.

13. The device of claim 12 further comprising:
a conductive layer overlapping the opening, with a portion of the semiconductor substrate being located between the opening and the conductive layer; and
a conductive back-plate overlapping the conductive layer and the opening, wherein the conductive back-plate and the conductive layer are separated from each other by an air gap, and the conductive layer, the air gap, and the conductive back-plate collectively form a capacitor.

14. The device of claim 12 further comprising:
a plurality of openings penetrating through the semiconductor substrate, wherein the plurality of openings are joined to the opening.

15. The device of claim 12, wherein edges of a portion of the opening in the supporting substrate are substantially straight.

16. The device of claim 12, wherein the supporting substrate comprises a silicon substrate.

17. The device of claim 12, wherein the semiconductor substrate further comprises sidewalls facing the opening, with the sidewalls joined to the second bottom surface that is continuously curved.

18. A device comprising:
a device die comprising:
a semiconductor substrate; and
a plurality of dielectric layers over the semiconductor substrate, wherein portions of the semiconductor substrate and the plurality of dielectric layers form a membrane configured to vibrate, and wherein edge portions of the membrane are increasingly thicker than middle portions of the membrane;
a bonding layer underlying and bonded to the semiconductor substrate; and
a supporting substrate underlying and bonded to the bonding layer, wherein an opening is directly underlying the membrane, and extends into the semiconductor substrate and penetrates through the bonding layer and the supporting substrate.

19. The device of claim 18, wherein the opening is arched.

20. The device of claim 18 further comprising a plurality of openings penetrating through the semiconductor substrate and the plurality of dielectric layers, wherein the plurality of openings are joined to the opening.

* * * * *